United States Patent
Bai et al.

(10) Patent No.: US 11,988,968 B2
(45) Date of Patent: May 21, 2024

(54) METHOD FOR DETECTING OVERLAY PRECISION AND METHOD FOR COMPENSATING OVERLAY DEVIATION

(71) Applicants: Semiconductor Manufacturing International (Shanghai) Corporation, Shanghai (CN); Semiconductor Manufacturing International (Beijing) Corporation, Beijing (CN)

(72) Inventors: Song Bai, Shanghai (CN); Qiliang Ma, Shanghai (CN); Tao Song, Shanghai (CN); Sha Sha, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 903 days.

(21) Appl. No.: 17/060,415

(22) Filed: Oct. 1, 2020

(65) Prior Publication Data
US 2021/0208514 A1    Jul. 8, 2021

(30) Foreign Application Priority Data
Jan. 8, 2020 (CN) .......................... 202010018880.0

(51) Int. Cl.
*G03F 7/00* (2006.01)
*G06T 7/00* (2017.01)
*H01L 21/66* (2006.01)

(52) U.S. Cl.
CPC ........ *G03F 7/70633* (2013.01); *G06T 7/0004* (2013.01); *H01L 22/20* (2013.01); *G06T 2207/30148* (2013.01)

(58) Field of Classification Search
USPC ....................................................... 356/4.01
See application file for complete search history.

(56) References Cited

U.S. PATENT DOCUMENTS 10,474,045 B2 * 11/2019 Bijnen ................. G03F 9/7046
10,527,958 B2 *  1/2020 Tinnemans ......... G03F 7/70633
(Continued)

FOREIGN PATENT DOCUMENTS

CN      107850862 A    3/2018

OTHER PUBLICATIONS

English Translation of First Office Action for Chinese application 202010018880 (Publication CN 113093475A): 7 pages (Year: 2022).*

*Primary Examiner* — James R Hulka
(74) *Attorney, Agent, or Firm* — Anova Law Group, PLLC

(57) ABSTRACT

A method for detecting an overlay precision and a method for compensating an overlay deviation are provided. The method for detecting the overlay precision includes providing a wafer to-be-detected, where the wafer to-be-detected includes a photoresist layer which has been exposed and developed; performing a first detection on the wafer to-be-detected using an optical overlay precision measurement and acquiring first overlay precision information of the photoresist layer; performing a second detection on the wafer to-be-detected using the optical overlay precision measurement, and acquiring second overlay precision information of the photoresist layer, where a wavelength or a polarization direction of a light source of the second detection is different from a wavelength or a polarization direction of a light source of the first detection; and acquiring overlay precision deviation information of the wafer to-be-detected according to the first overlay precision information and the second overlay precision information.

18 Claims, 14 Drawing Sheets

(56) References Cited

U.S. PATENT DOCUMENTS

| | | | |
|---|---|---|---|
| 10,607,334 B2* | 3/2020 | Middlebrooks | G03F 7/705 |
| 10,732,513 B2* | 8/2020 | Middlebrooks | G03F 7/705 |
| 2012/0123581 A1* | 5/2012 | Smilde | G03F 7/70641 |
| | | | 706/12 |
| 2013/0308142 A1* | 11/2013 | Straaijer | G01B 11/02 |
| | | | 356/625 |
| 2015/0146188 A1* | 5/2015 | Lyulina | G03F 7/70633 |
| | | | 356/614 |
| 2018/0348654 A1* | 12/2018 | Bijnen | G03F 7/70508 |

* cited by examiner

METHOD FOR DETECTING OVERLAY PRECISION AND METHOD FOR COMPENSATING OVERLAY DEVIATION

CROSS-REFERENCE TO RELATED APPLICATION

This application claims the priority of Chinese Patent Application No. 202010018880.0, filed on Jan. 8, 2020, the content of which is incorporated herein by reference in its entirety.

TECHNICAL FIELD

The present disclosure generally relates to the field of semiconductor manufacturing and, more particularly, relates to a method for detecting an overlay precision and a method for compensating an overlay deviation.

BACKGROUND

Photolithography, a crucial technology in semiconductor manufacturing technology, can be used to implement pattern transfer from a mask to a silicon wafer to form a semiconductor product that can meet design requirements. In an exposure step of the photolithography process, light may first irradiate on a photoresist-coated silicon wafer through a light-transmitting or light-reflective region in the mask and have a photochemical reaction with the photoresist. The solubility degree of the exposed photoresist and the unexposed photoresist in a developer is used to form a photolithography pattern to implement the mask pattern transfer at a developing step. The silicon wafer is then etched based on the photolithography pattern formed by the photoresist layer to further transfer the mask pattern to the silicon wafer at an etching step. However, the overlay precision of the pattern transferred to the silicon wafer may not be desirable.

SUMMARY

One aspect of the present disclosure provides a method for detecting an overlay precision. The method includes providing a wafer to-be-detected, where the wafer to-be-detected includes a photoresist layer which has been exposed and developed; performing a first detection on the wafer to-be-detected using an optical overlay precision measurement and acquiring first overlay precision information of the photoresist layer; performing a second detection on the wafer to-be-detected using the optical overlay precision measurement, and acquiring second overlay precision information of the photoresist layer, where a wavelength or a polarization direction of a light source of the second detection is different from a wavelength or a polarization direction of a light source of the first detection; and acquiring overlay precision deviation information of the wafer to-be-detected according to the first overlay precision information and the second overlay precision information.

Optionally, the photoresist layer includes a plurality of mark patterns; the first overlay precision information includes a plurality of first overlay precisions, each being acquired according to one mark pattern; and the second overlay precision information includes a plurality of second overlay precisions, each being acquired according to one mark pattern.

Optionally, the overlay precision deviation information of the wafer to-be-detected includes a plurality of deviation values, each being acquired according to a vector difference between one first overlay precision and one second overlay precision.

Optionally, the optical overlay precision measurement includes one of an overlay precision measurement based on imaging and image recognition and an overlay precision measurement based on diffraction.

One aspect of the present disclosure provides a method for compensating an overlay deviation. The method includes providing a plurality of first wafers; acquiring a first compensation parameter through the plurality of first wafers; providing a plurality of second wafers, each including a second layer to-be-etched and a second initial photoresist layer on the second layer to-be-etched; according to the first compensation parameter, exposing and developing the second initial photoresist layer of each second wafer to form a second photoresist layer; after forming the second photoresist layer, using more than one second wafers in the plurality of second wafers as second wafers to-be-detected, and acquiring second overlay precision deviation information of the second wafers to-be-detected according to a method for detecting an overlay precision, where the method for detecting the overlay precision includes providing a wafer to-be-detected, where the wafer to-be-detected includes a photoresist layer which has been exposed and developed; performing a first detection on the wafer to-be-detected using an optical overlay precision measurement and acquiring first overlay precision information of the photoresist layer; performing a second detection on the wafer to-be-detected using the optical overlay precision measurement, and acquiring second overlay precision information of the photoresist layer, where a wavelength or a polarization direction of a light source of the second detection is different from a wavelength or a polarization direction of a light source of the first detection; and acquiring overlay precision deviation information of the wafer to-be-detected according to the first overlay precision information and the second overlay precision information; and according to the second overlay precision deviation information, performing a compensation processing on each of the second wafers, where the compensation processing includes removing the second photoresist layer or etching the second layer to-be-etched using the second photoresist layer as a mask.

Optionally, according to the second overlay precision deviation information, performing the compensation processing on each of the second wafers includes when the second overlay precision deviation information is within a preset range, etching the second layer to-be-etched using the second photoresist layer as the mask; and when the second overlay precision deviation information is outside the preset range, removing the second photoresist layer.

Optionally, each of the plurality of first wafers includes a first layer to-be-etched and a first initial photoresist layer on the first layer to-be-etched.

Optionally, the method further includes using more than one first wafers in the plurality of first wafers as first wafers to-be-detected; before acquiring the first compensation parameter, exposing and developing the first initial photoresist layer of a first wafer to-be-detected to form a first photoresist layer; and after forming the first photoresist layer, according to the method for detecting the overlay precision, acquiring first overlay precision deviation information, the first overlay precision information and the second overlay precision information of the first wafer to-be-detected.

Optionally, according to the second overlay precision deviation information, performing the compensation processing on each of the second wafers includes acquiring an error parameter according to the first overlay precision deviation information and the second overlay precision deviation information; when the error parameter is within a preset range, etching the second layer to-be-etched using the second photoresist layer as the mask; and when the error parameter is outside the preset range, removing the second photoresist layer.

Optionally, the error parameter is acquired according to a deviation between the first overlay precision deviation information and the second overlay precision deviation information.

Optionally, third deviation information is acquired according to a deviation between the first overlay precision deviation information and the second overlay precision deviation information; the third deviation information is used as a sample to obtain deviation normal distribution information; and the error parameter is obtained according to the deviation normal distribution information.

Optionally, forming the first photoresist layer includes using more than one first wafers in the plurality of first wafers as third wafers to-be-detected; exposing and developing a first initial photoresist layer of a third wafer to-be-detected to form a third photoresist layer; using the third photoresist layer as a mask, etching a first layer to-be-etched of the third wafer to-be-detected to form a third etched layer; using a measurement of a scanning electron microscope, acquiring fourth overlay precision information of the third etched layer of the third wafer to-be-detected; and according to the fourth overlay precision information, exposing and developing the first initial photoresist layer of the first wafer to-be-detected to form the first photoresist layer.

Optionally, the first compensation parameter is acquired according to the fourth overlay precision information and the first overlay precision information of the first wafer to-be-detected; or the first compensation parameter is acquired according to the fourth overlay precision information and the second overlay precision information of the first wafer to-be-detected.

Optionally, the third etched layer includes a plurality of third mark patterns; and the fourth overlay precision information includes a plurality of fourth overlay precisions, each being acquired according to one of the plurality of third mark patterns.

Optionally, the first photoresist layer includes a plurality of first mark patterns corresponding to the plurality of third mark patterns; the first overlay precision information of the first wafer to-be-detected includes a plurality of first overlay precisions of the first wafers to-be-detected, each first overlay precision being acquired according to a first mark pattern; the second overlay precision information of the first wafer to-be-detected includes a plurality of second overlay precisions of the first wafers to-be-detected, each second overlay precision being acquired according to a first mark pattern; and the first compensation parameter includes a plurality of first compensation values, each being a sum of a fourth overlay precision and a first overlay precision or a second overlay precision of a corresponding first wafer to-be-detected.

Optionally, acquiring the first compensation parameter includes using the first photoresist layer of the first wafer to-be-detected as a mask, the first layer to-be-etched of the first wafer to-be-detected is etched to form a first etched layer; and using a measurement of a scanning electron microscope, third overlay precision information of the first etched layer of the first wafer to-be-detected is acquired.

Optionally, the compensation processing further includes, after removing the second photoresist layer, forming a fourth photoresist layer on the second layer to-be-etched.

Optionally, the photoresist layer includes a plurality of mark patterns; the first overlay precision information includes a plurality of first overlay precisions, each being acquired according to one mark pattern; and the second overlay precision information includes a plurality of second overlay precisions, each being acquired according to one mark pattern.

Optionally, the overlay precision deviation information of the wafer to-be-detected includes a plurality of deviation values, each being acquired according to a vector difference between one first overlay precision and one second overlay precision.

Optionally, the optical overlay precision measurement includes one of an overlay precision measurement based on imaging and image recognition and an overlay precision measurement based on diffraction.

Compared with the existing technology, the technical solutions provided by the present disclosure may achieve at least the following beneficial effects.

The technical solutions of the present disclosure provide the method for detecting the overlay precision. Two detections, i.e., the first detection and the second detection, may be performed on the wafer to-be-detected using the optical overlay precision measurement, and the light sources of two detections may be different. In such two detections, when the mark pattern of the front layer is deformed relative to the photoresist layer due to the influence of the processes including etching, the overlay precision information acquired based on the detections with different light sources may be different. Therefore, the deviation information acquired through two detections can be used to determine whether the pattern of the front layer is deformed, and the deformation degree and manner. Therefore, it can determine that whether the first overlay precision information and the second overlay precision information include information other than the overlay deviation between the photoresist layer and the front layer, that is, whether the generated deformation of the front layer affects the accuracy of the first overlay precision information or the second overlay precision information. When reforming the photoresist layer on the wafer, the process for forming the photoresist layer may be adjusted according to the deviation information; or the process for etching the layer to-be-etched using the photoresist layer as a mask may be adjusted, thereby improving the overlay precision of the pattern transferred to the layer to-be-etched. In such way, the performance and the performance stability of the semiconductor structure may be improved.

Furthermore, since the photoresist includes the plurality of mark patterns, more overlay precision information may be acquired through the first and second detections, thereby reflecting the deformation of entire front layer more thoroughly and accurately.

Furthermore, since the deviation information includes the plurality of vector difference information, the vector difference information may include the distance and direction of the deformation. Whether the pattern of the front layer is deformed, and the deformation degree and manner may be determined based on such simple manner.

Correspondingly, the technical solutions of the present disclosure provide the method for compensating the overlay deviation. One the one hand, the first compensation parameter is used in the exposing and developing step for forming the second photoresist layer, such that the exposing and developing step may be calibrated based on the process deviation of the first wafer, which may not only improve the overlay precision of the second photoresist, but also reduce the time and cost for acquiring the compensation parameter by detecting a portion of the second wafers in the plurality of second wafers and forming the photoresist layers of the other portion of the second wafers in the plurality of second wafers using the compensation parameter. On the other hand, the compensation processing may be perform according to the second overlay precision deviation information, such that the pattern deformation of the second front layer may be determined according to the second overlay precision deviation information, that is, it may determine whether the pattern overlay precision of the second photoresist formed through the calibrated exposing and developing step is relatively accurate. Furthermore, when the pattern overlay precision of the second photoresist formed is relatively accurate, the second photoresist layer may be used as a mask to etch the second layer to-be-etched, thereby improving the overlay precision of the formed pattern by subsequently etching the layer to-be-etched to improve the overlay precision of the pattern transferred to the second wafer. When the pattern overlay precision of the second photoresist formed is not relatively accurate, the second photoresist layer may be removed. Therefore, the semiconductor structure with a relatively low overlay precision formed by etching the second layer to-be-etched using the second photoresist with a low overlay precision as the mask may be reduced; and the photoresist layer with a relatively high overlay precision may be subsequently reformed on the surface of the second layer to-be-etched with relatively low cost. In such way, the overlay precision of the pattern formed by subsequently etching the second layer to-be-etched may be improved, thereby improving the overlay precision of the pattern transferred to the second wafer.

Furthermore, when the second overlay precision deviation information is within the preset range, the second layer to-be-etched is etched using the second photoresist layer as the mask; and when the second overlay precision deviation information is outside the preset range, the second photoresist layer is removed. Therefore, it may realize that the second photoresist with a relatively high precision may be used as the mask to etch the second layer to-be-etched, such that the precision of the pattern transferred to the second layer to-be-etched may be relatively high; and when the pattern deformation degree of the front layer is relatively large (i.e., when the overlay precision of the second photoresist is relatively low), the second photoresist layer may be removed. On the one hand, the pattern of the second photoresist with a low overlay precision may not be transferred to the second layer to-be-etched, that is, the possibility of the pattern of the second layer to-be-etched with a low overlay precision may be reduced. On the other hand, the second photoresist layer is removed before etching the second layer to-be-etched, such that the second layer to-be-etched may still be formed into the pattern with a relatively high overlay precision, that is, the second layer to-be-etched may be formed into the pattern according to the photoresist layer formed subsequently with a high overlay precision. In such way, the overlay precision of the pattern transferred to the wafer may be improved; meanwhile, it may reduce discarded wafers with low pattern precisions formed after etching the second layers to-be-etched or reduce more complicated subsequent process treatment in order to compensate the relatively large pattern overlay deviation, thereby saving the cost in the semiconductor fabricating process.

Furthermore, the error parameter may be acquired according to the first overlay precision deviation information and the second overlay precision deviation information. Therefore, the error parameter may be used to acquire the differences between the deformation magnitude and manner of the pattern of the front layer of the second photoresist layer and the deformation magnitude and manner of the pattern of the front layer of the first photoresist layer. In such way, it may more accurately determine that whether the calibration of the first compensation parameter on the exposure and development step for forming the second photoresist layer is accurate. When the calibration is relatively accurate, that is, the error parameter is within the preset range, the second photoresist layer may be used as the mask to etch the second layer to-be-etched, and it may realize that the second photoresist layer with a relatively high overlay precision may be used as a mask to etch the second layer to-be-etched, such that the precision of the pattern transferred to the second layer to-be-etched may has a high precision. When the calibration is not relatively accurate, that is, the error parameter is outside the preset range, the second photoresist layer may be removed. Therefore, on the one hand, the pattern of the second photoresist with a low overlay precision may not be transferred to the second layer to-be-etched, that is, the possibility of the pattern of the second layer to-be-etched with a low overlay precision may be reduced; on the other hand, the second photoresist layer is removed before etching the second layer to-be-etched, such that the second layer to-be-etched may still be formed into the pattern with a relatively high overlay precision, that is, the second layer to-be-etched may be formed into the pattern according to the photoresist layer formed subsequently with a high overlay precision. In such way, the overlay precision of the pattern transferred to the wafer may be improved; meanwhile, it may reduce discarded wafers with low pattern precisions formed after etching the second layers to-be-etched or reduce more complicated subsequent process treatment in order to compensate the relatively large pattern overlay deviation, thereby saving the cost in the semiconductor fabricating process.

Furthermore, the fourth overlay precision information with a relatively high precision may be obtained by the measurement of the scanning electron microscope and may be used for forming the first photoresist layer, that is, the fourth overlay precision information may be used to calibrate the exposing and developing step for forming the first photoresist layer, such that the first wafer to-be-detected with a high precision may be formed. In such way, the overlay precision of the first wafer to-be-detected may be improved; moreover, it may reduce discarded first wafers to-be-detected formed with low pattern precisions after etching the first layers to-be-etched, thereby improving the semiconductor structure performance and saving the process cost.

Furthermore, the first compensation parameter may be acquired according to the fourth overlay precision information and the first overlay precision information or the second overlay precision information of the first wafers to-be-detected. On the one hand, the first overlay precision information is acquired by detecting the first photoresist layer formed by the calibrated exposure and development step, such that the first compensation parameter may be more accurate. On the other hand, the measurement time based on the scanning electron microscopy may be longer. The information acquired by the measurement based on the scanning electron microscope may not only be applied to the process of the first photoresist layer, but also be applied to the process of the second photoresist. Therefore, while improving the overlay precision of the second photoresist layer, it may reduce the time used for performing the measurement overlay deviation of the second photoresist based on the scanning electron microscopy measurement to form the new second photoresist with high overlay precision, thereby reducing the time for forming the second wafer subsequently.

Furthermore, the third overlay precision information is acquired using the measurement of the scanning electron microscope, such that the overlay precision acquired by the measurement technology is relatively high. Therefore, the third overlay precision information used as the first compensation parameter may further improve the pattern overlay precision of the second photoresist subsequently formed.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

A method for detecting an overlay precision and a method for compensating an overlay deviation are provided. The method for detecting the overlay precision includes providing a wafer to-be-detected, where the wafer to-be-detected includes a photoresist layer which has been exposed and developed; performing a first detection on the wafer to-be-detected using an optical overlay precision measurement and acquiring first overlay precision information of the photoresist layer; performing a second detection on the wafer to-be-detected using the optical overlay precision measurement, and acquiring second overlay precision information of the photoresist layer, where a wavelength or a polarization direction of a light source of the second detection is different from a wavelength or a polarization direction of a light source of the first detection; and acquiring overlay precision deviation information of the wafer to-be-detected according to the first overlay precision information and the second overlay precision information.

FIGS. 1-4 illustrate structural schematics of an exemplary method for compensating a wafer overlay deviation.

Figure 1:
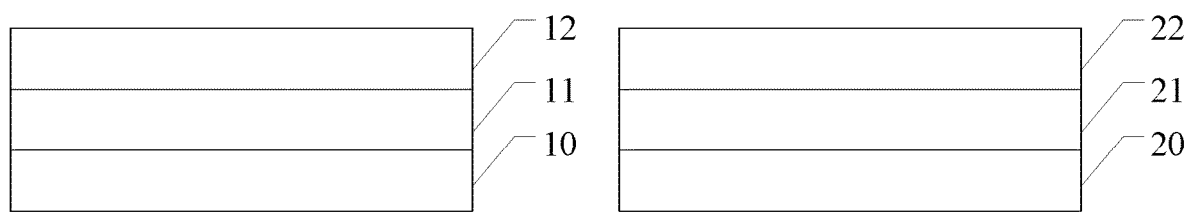
FIGS. 1-4 illustrate structural schematics of an exemplary method for compensating a wafer overlay deviation.
Figure 2:
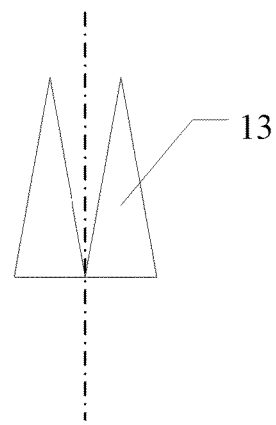

Referring to FIGS. 1-2, FIG. 1 illustrates cross-sectional structural schematics of a first wafer to-be-detected and a second batch of wafers; and FIG. 2 illustrates a structural schematic of a first mark pattern.

A first batch of wafers (not labeled) and the second batch of wafers (not labeled) may be provided. The first batch of wafers may include one or more first wafers to-be-detected (not labeled). The first wafer to-be-detected may include a first front layer 10, a first layer to-be-etched 11 on the surface of the first front layer 10, and a first photoresist layer 12 on the surface of the first layer to-be-etched 11.

The first photoresist layer 12 may have been exposed and developed.

The first front layer 10 may include a plurality of first mark patterns 13, and the first photoresist layer 12 may include a plurality of second mark patterns (not labeled).

On the one hand, the plurality of first mark patterns 13 may be used as the alignment mark of the pattern of the first front layer 10 and the pattern of the first photoresist layer 12 in the exposure and development step for forming the first photoresist layer 12, such that the formed pattern of the first photoresist layer 12 may be aligned with the pattern of the first front layer 10. Therefore, when the first layer to-be-etched 11 is subsequently etched using the first photoresist layer 12 as a mask, the pattern formed after etching the first layer to-be-etched 11 may be aligned with the pattern of the first front layer 10. On the other hand, after forming the first photoresist layer 12, the plurality of first mark patterns 13 may be used as the reference for detecting the overlay precision of the formed first photoresist layer 12, that is, as the reference for detecting the deviation degree of the plurality of the second mark patterns relative to the first front layer 10.

Each of the second batch of wafers may include a second front layer 20, a second layer to-be-etched 21 on the surface of the second front layer 20, and a second initial photoresist layer 22 on the surface of the second layer to-be-etched 21.

The second front layer 20 may include a plurality of third mark patterns.

The plurality of third mark patterns may be used as the reference for aligning the pattern of the second initial photoresist layer 22 with the pattern of the second front layer 20 when a second photoresist layer is subsequently formed.

The second initial photoresist layer 22 may be used to subsequently form the second photoresist layer.

Figure 3:
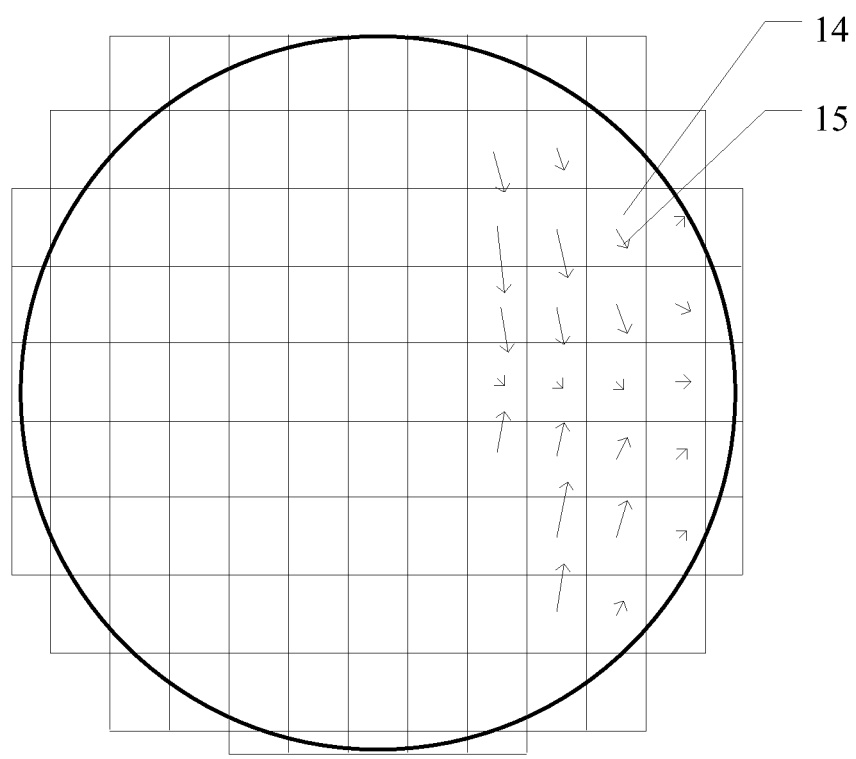

Referring to FIGS. 1-3, FIG. 3 illustrates a schematic of a first overlay precision information in FIG. 1, and the overlay precision measurement based on the imaging and image recognition (e.g., image-based overlay (IBO)) may be used to detect the overlay precision of the first photoresist layer 12 to acquire the first overlay precision information.

The first wafer to-be-detected may include a plurality of exposure fields (e.g., shots) 14. Each exposure field may include more than one first mark patterns 13 and more than one second mark patterns. Along the direction perpendicular to the surface of the first photoresist layer 12, each first mark pattern 13 may correspond to one second mark pattern.

The detection of the overlay precision of the first photoresist layer 12 may refer to detecting the overlay precision of the second mark pattern in each exposure field 14, that is, the deviation direction and deviation magnitude of the second mark pattern relative to the corresponding first mark pattern 13 along the direction parallel with the surface of the first photoresist layer 12.

Therefore, the first overlay precision information may include the overlay precisions of the plurality of second mark patterns, that is, the vector directions and vector magnitudes of a plurality of vector arrows 15.

It should be noted that the vector direction and vector magnitude indicated by the vector arrow 15 may be the deviation direction and deviation magnitude of the second mark pattern relative to the corresponding first mark pattern 13.

It should be noted that the exposure field refers to the region covered by the photolithograph machine for one-time imaging. In the process of fabricating integrated circuits on the wafer, the wafer may be divided into a plurality of exposure fields as the basic units for the convenience of process fabrication, where the exposure fields may be arranged on the wafer periodically and repeatedly.

It should be noted that FIG. 3 may only exemplarily illustrate a portion of vector arrows 15.

Figure 4:
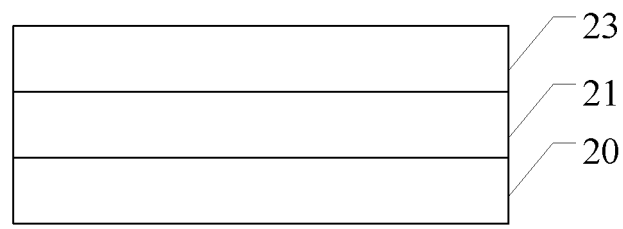

Referring to FIG. 4, the second initial photoresist layer 22 may be exposed and developed to form a second photoresist layer 23.

When exposing and developing the second initial photoresist layer 22, the first overlay precision information may be used as the compensation parameter to calibrate the exposure and development step of the second initial photoresist layer 22. That is, the detected overlay deviation directions and deviation magnitudes of the plurality of second mark patterns may be used for compensating the process parameter of the exposure and development step of the second initial photoresist layer 22.

In the above-mentioned method, the overlay precision of the first wafer to-be-detected may be used as the parameter which is compensated into the process parameter of the exposure and development step for forming the second photoresist layer 23, thereby reducing the overlay deviation of the second photoresist layer 23.

However, the processes including etching the first front layer 10 may cause the deformation of the first mark pattern 13, such that the first mark pattern 13 is deformed from a symmetric pattern to an asymmetric pattern, that is, the center position of the first mark pattern 13 may be difficult to be determined. Therefore, the detected first overlay precision information may include the deviation of the second mark pattern relative to the first front layer and also include the error caused by the deformation of the first mark pattern 13. However, it is impossible to determine whether the above-mentioned error is included in the data detected by the overlay precision measurement of one-time imaging and image recognition. Meanwhile, it is possible that the third mark pattern may also be deformed due to the influence of the process for forming the second front layer 20. Therefore, when the deformation of one or both of the first mark pattern 13 and the third mark pattern is serious and the difference between the deformation directions or magnitudes of above two mark patterns is relatively large, the overlay precision of the formed second photoresist layer 23 may be reduced by using the first overlay precision information as the compensation parameter for forming the second photoresist layer 23, such that the overlay precision of the pattern transferred to the silicon wafer may be relatively low.

In order to solve the above-mentioned technical problems, the technical solutions of the present disclosure provide a method for detecting an overlay precision and a method for compensating an overlay deviation. The method for detecting the overlay precision may obtain the deviation information of the overlay precision of the wafer to-be-detected by detecting the wafer to-be-detected using the overlay precision measurement with two-time imaging and image recognition; the method for compensating the overlay deviation may perform the compensation processing on the wafer to-be-etched based on the overlay precision deviation information of the wafer to-be-etched which is measured by the method for detecting the overlay precision, such that the overlay precision of the pattern transferred to the wafer to-be-etched may be improved to reduce the overlay deviation of the pattern.

In order to further illustrate the above described objectives, features, and advantages of the present disclosure, various specific embodiments of the present disclosure are described in detail with reference to the accompanying drawings hereinafter.

Figure 5:
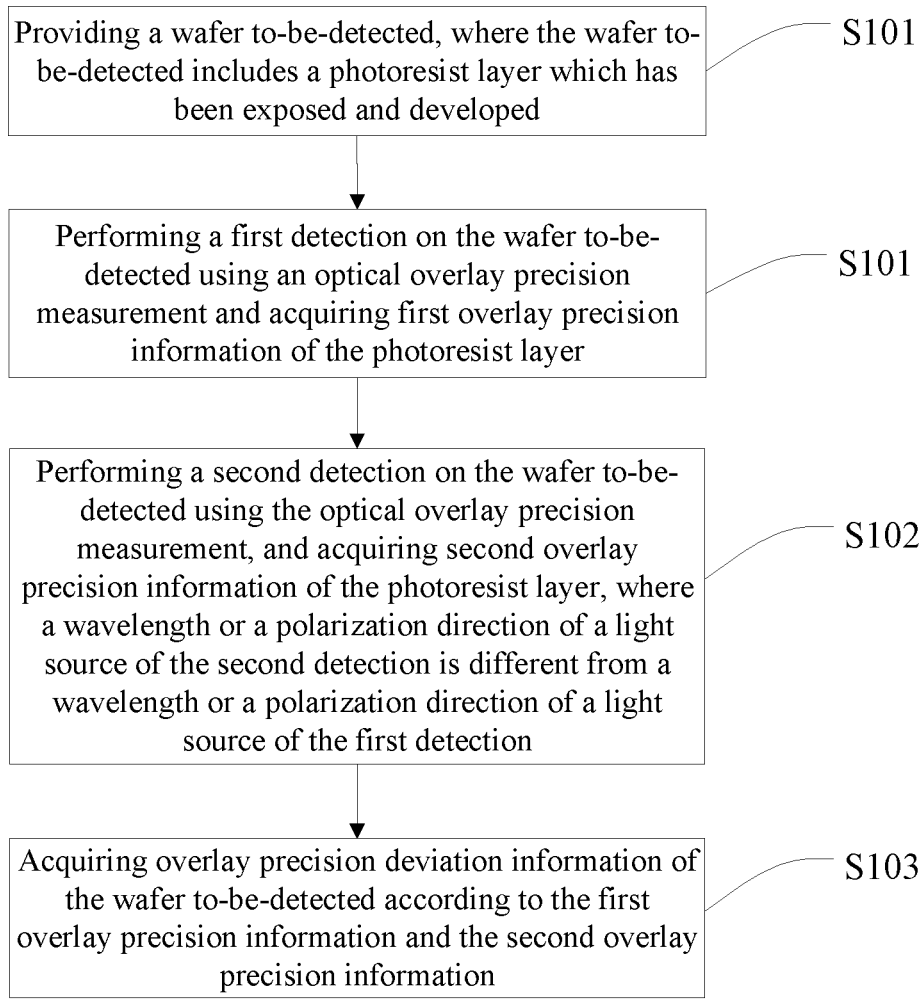
FIG. 5 illustrates a flowchart of an exemplary method for detecting an overlay precision according to various disclosed embodiments of the present disclosure.

FIG. 5 illustrates a flowchart of an exemplary method for detecting an overlay precision according to various disclosed embodiments of the present disclosure.

Referring to FIG. 5, the method for detecting the overlay precision may include:

S100, providing a wafer to-be-detected, where the wafer to-be-detected may include a photoresist layer which has been exposed and developed;

S101, performing a first detection on the wafer to-be-detected using an optical overlay precision measurement, and acquiring first overlay precision information of the photoresist layer;

S102, performing a second detection on the wafer to-be-detected using the optical overlay precision measurement, and acquiring second overlay precision information of the photoresist layer, where the wavelength or the polarization direction of the light source of the second detection may be different from the wavelength or the polarization direction of the light source of the first detection; and S103, acquiring the overlay precision deviation information of the wafer to-be-detected according to the first overlay precision information and the second overlay precision information.

FIGS. 6-10 illustrate structural schematics corresponding to certain stages of an exemplary method for detecting an overlay deviation according to various disclosed embodiments of the present disclosure.

Figure 6:
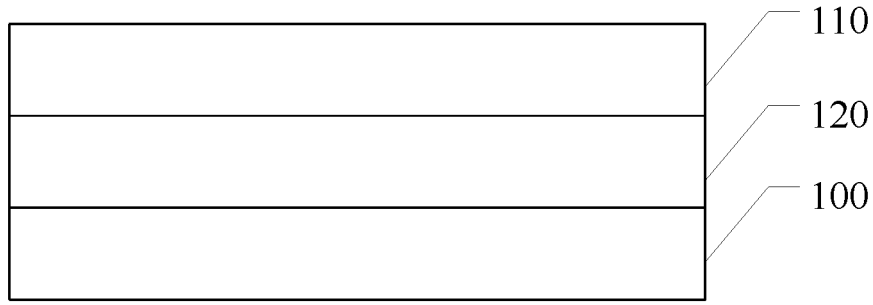
FIGS. 6-10 illustrate structural schematics corresponding to certain stages of an exemplary method for detecting an overlay deviation according to various disclosed embodiments of the present disclosure.
Figure 7:
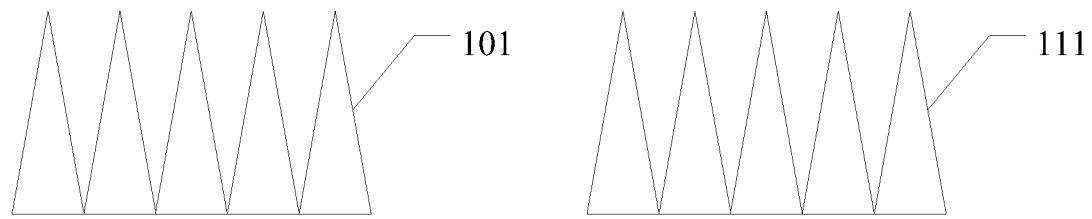

Referring to FIGS. 6-7, FIG. 6 illustrates the cross-sectional structural schematic of the wafer to-be-detected; and FIG. 7 illustrates the cross-sectional structural schematic of the mark patterns of the front layer and the photoresist layer in FIG. 6. The wafer to-be-detected may be provided and include a front layer 100, a layer to-be-etched 120 on the front layer 100, and a photoresist layer 110 on the layer to-be-etched 120.

The front layer 100 may be a pattern layer after etching, and the photoresist layer 110 may be a photoresist layer after exposure and development and before etching.

The photoresist layer 110 may be used as a mask for subsequent etching the layer to-be-etched 120.

In one embodiment, the front layer 100 may include a plurality of mark patterns 101, and the photoresist layer 110 may include a plurality of mark patterns 111.

On the one hand, the plurality of mark patterns 101 and mark patterns 111 may be used as the alignment mark of the pattern of the photoresist layer 110 and the pattern of the front layer 100 in the exposure and development step for forming the photoresist layer 110 to align the pattern of the formed photoresist layer 110 with the pattern of the front layer 100. In such way, when the layer to-be-etched 120 is subsequently etched using the photoresist layer 110 as a mask, the pattern formed after etching the layer to-be-etched 120 may be aligned with the pattern of the front layer 100. On the other hand, after the photoresist layer 110 is formed, the plurality of mark patterns 101 and mark patterns 111 may be used to subsequently detect the overlay precision of the formed photoresist layer 110, that is, may be used to the deviation degree between each mark pattern 111 of the plurality of mark patterns 111 and the corresponding mark pattern 101 in the front layer 100.

Since the front layer 100 includes the plurality of mark patterns 101 and the photoresist layer 110 includes the plurality of mark patterns 111, more overlay precision information may be acquired by subsequently performing the first detection and the second detection, which may comprehensively and accurately reflect the deformation of the entire front layer 100.

In another embodiment, the front layer may only include one mark pattern or may not include the mark pattern; and the photoresist layer may only include one mark pattern or may not include the mark pattern. If the photoresist layer and the front layer do not include the mark pattern, during the exposure and development process for forming the photoresist layer, the photoresist layer may be aligned with the front layer through the photoresist pattern, that is, the pattern with a device function or electrical interconnection function in the photoresist layer.

It should be noted that FIG. 7 only exemplarily illustrates one mark pattern 101 in the plurality of mark patterns 101, and one mark pattern 111 in the plurality of mark patterns 111.

Figure 8:
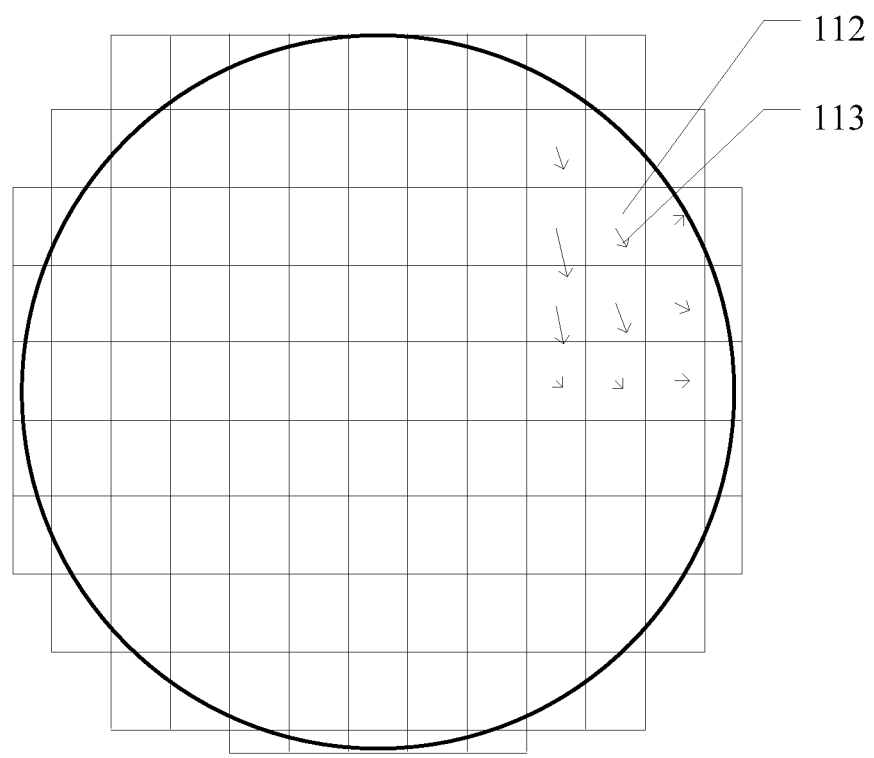

Referring to FIG. 8, FIG. 8 exemplarily illustrates a schematic of the first overlay precision information of the photoresist layer in FIG. 6. The first detection may be performed on the wafer to-be-detected using the optical overlay precision measurement to acquire the first overlay precision information of the photoresist layer 110.

The optical overlay precision measurement may include the overlay precision measurement based on the imaging and image recognition or the overlay precision measurement based on diffraction (e.g., diffraction-based overlay DBO).

In one embodiment, the optical overlay precision measurement may be the overlay precision measurement based on the imaging and image recognition.

The forming processes including etching may affect the pattern of the front layer 100, including causing a relatively large deformation of the edge morphology and a relatively small deformation of the middle morphology of the pattern. Taking the mark pattern 101 as an example, after completing a plurality of etching processes and the like, the portion of the mark pattern 101 closest to two edges of the triangle may have the largest deformation, and the portion of the mark pattern 101 closest to the middle of the triangle may have less deformation. The overlay precision measurement based on the imaging and image recognition may detect the pattern edge morphology of the front layer 100 and the photoresist layer 110, that is, the overlay precision measurement based on the imaging and image recognition may detect the morphology of the triangle adjacent to the outer side of the mark pattern 101. In addition, the detection result of the overlay precision measurement based on the imaging and image recognition may be used to detect patterns, that is, the edge morphology of the mark pattern 111 of the photoresist 110 and the mark pattern 101 of the front layer 100 may mainly reflect the overlay precision of the detected patterns. Therefore, the overlay precision measurement based on the imaging and image recognition may be more sensitive to the pattern deformation of the front layer 100 caused by the processes including etching. When the pattern of the front layer 100 is deformed due to the processes including etching, measurement distortion may be easily detected when the overlay precision is detected by the overlay precision measurement based on the imaging and image recognition, such that the pattern deformation of the front layer 100 may be more obviously reflected.

In another embodiment, the optical overlay precision measurement may be the overlay precision measurement based on diffraction.

The wafer to-be-detected may include a plurality of exposure fields 112. Each exposure field 112 may include more than one mark patterns 101 and more than one mark patterns 111. Along the direction perpendicular to the surface of the photoresist layer 110, each mark pattern 111 may correspond to one mark pattern 101.

The first overlay precision information may include a plurality of first overlay precisions (or precision values), and each first overlay precision may be acquired based on one mark pattern 111.

For example, acquiring each first overlay precision based on one mark pattern 111 may refer to that the overlay precision of the mark pattern 111 in each of the exposure fields 112 may be detected in the first detection. That is, along the direction parallel with the surface of the photoresist layer 110, the deviation directions and deviation magnitudes of the mark patterns 101 relative to the corresponding mark patterns 111, that is, the vector directions and vector magnitudes of the plurality of vector arrows 113, may be detected.

It should be noted that the vector direction and vector magnitude indicated by the vector arrow 113 may be the deviation direction and deviation magnitude of the mark pattern 111 relative to the corresponding mark pattern 101.

It should be noted that the exposure field refers to the region covered by the photolithograph machine for one-time imaging. In the process of fabricating integrated circuits on the wafer, the wafer may be divided into a plurality of exposure fields as the basic units for the convenience of process fabrication, where the exposure fields may be arranged on the wafer periodically and repeatedly.

Figure 9:
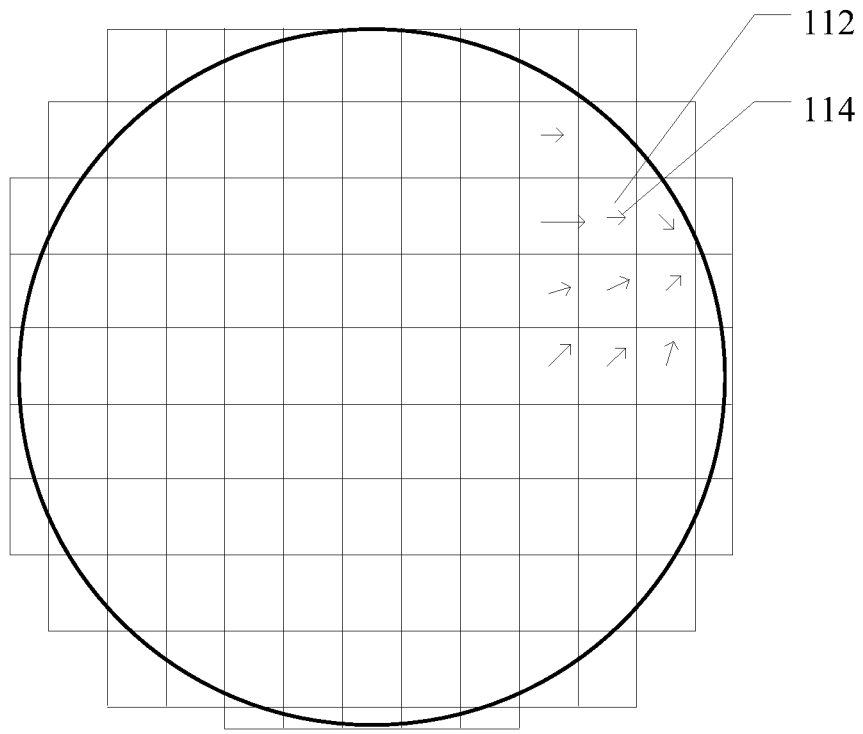

Referring to FIG. 9, FIG. 9 exemplarily illustrates a schematic of the second overlay precision information of the photoresist layer in FIG. 6. The second detection may be performed on the wafer to-be-detected using the optical overlay precision measurement to acquire the second overlay precision information of the photoresist layer 110. The wavelength or polarization direction of the light source of the second detection may be different from the wavelength or polarization direction of the light source of the first detection.

The optical overlay precision measurement may include the overlay precision measurement based on the imaging and image recognition or the overlay precision measurement based on diffraction.

In one embodiment, the optical overlay precision measurement technology may be the overlay precision measurement based on the imaging and image recognition.

In one embodiment, the wavelength of the light source of the second detection may be different from the wavelength of the light source of the first detection.

In another embodiment, the polarization direction of the light source of the second detection may be different from the polarization direction of the light source of the first detection.

In other embodiments, the wavelength or polarization direction of the light source of the second detection may both be different from the wavelength or polarization direction of the light source of the first detection.

The second overlay precision information may include a plurality of second overlay precisions (or precision values), and each second overlay precision may be acquired based on one mark pattern 111.

For example, acquiring each second overlay precision based on one mark pattern 111 may refer to that the overlay precision of the mark pattern 111 in each of the exposure fields 112 may be detected in the second detection. That is, along the direction parallel with the surface of the photoresist layer 110, the deviation directions and deviation magnitudes of the mark patterns 101 relative to the corresponding mark patterns 111, that is, the vector directions and vector magnitudes of the plurality of vector arrows 114, may be detected.

It should be noted that the vector direction and vector magnitude indicated by the vector arrow 114 may be the deviation direction and the deviation magnitude of the mark pattern 111 relative to the corresponding mark pattern 101.

The wavelength or polarization direction of the light source of the second detection may be different from the wavelength or polarization direction of the light source of the first detection. When the mark pattern 101 of the front layer 100 is not deformed, the overlay precision information acquired based on the detections with different light sources may be same. That is, no deviations may be between the plurality of first overlay precisions and the plurality of corresponding second overlay precisions. When the mark pattern 101 of the front layer 100 is deformed due to the influence of the processes including etching, the overlay precision information acquired based on the detections with different light sources may be different and deviations may be between the plurality of first overlay precisions and the plurality of corresponding second overlay precisions, that is, a vector direction deviation and a vector magnitude deviation may be between each vector arrow 113 and its corresponding vector arrow 114. Therefore, the deviation information acquired through two detections, that is, the vector direction deviation and the vector magnitude deviation between each vector arrow 113 and its corresponding vector arrow 114, can be used to determine whether the pattern of the front layer 100 is deformed, and the deformation degree and manner. It can be determined that whether the first overlay precision information and the second overlay precision information include information other than the pattern overlay deviation between the photoresist layer 110 and the front layer 100, that is, whether the generated deformation of the front layer 100 affects the accuracy of the first overlay precision information or the second overlay precision information. Moreover, it can be subsequently determined that whether the pattern deformation of the front layer 100 greatly affects the pattern overlay precision of the photoresist layer 110 according to the deviation information. Furthermore, when the pattern overlay precision of the photoresist layer 100 is relatively low, the process for etching the layer to-be-etched 120 using the photoresist layer 110 as a mask can be adjusted according to the deviation information, thereby improving the overlay precision of the pattern transferred to the layer to-be-etched 120. Or, the photoresist layer 110 may be removed and a new photoresist layer may be formed before etching the layer to-be-etched 120; meanwhile, when forming the new photoresist layer, the processing for forming the new photoresist layer may be adjusted according to the deviation information, thereby improving the overlay precision of the pattern transferred to the layer to-be-etched 120. In such way, the performance and the performance stability of the semiconductor structure may be improved.

Furthermore, compared with the measurement of the scanning electron microscope, the optical overlay precision measurement may need less time and cost to detect the wafer to-be-detected, such that the time and cost for detecting the overlay precision of the wafer to-be-detected may be reduced.

Figure 10:
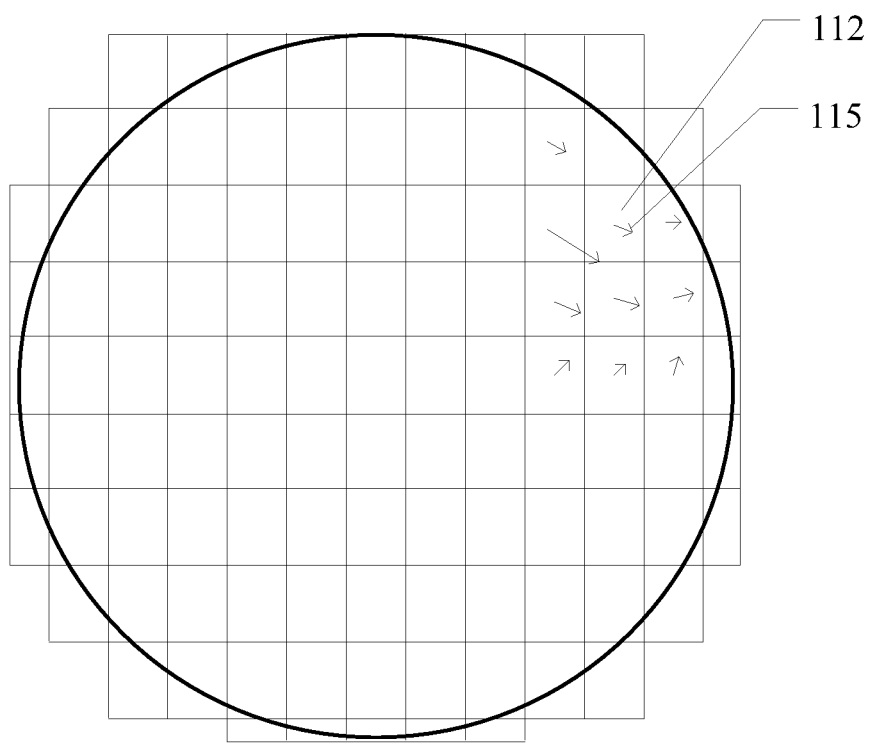

Referring to FIG. 10, FIG. 10 illustrates a schematic of the overlay precision deviation information in FIG. 6. The overlay precision deviation information of the wafer to-be-detected may be acquired according to the first overlay precision information and the second overlay precision information.

In one embodiment, the overlay precision deviation information of the wafer to-be-detected may include a plurality of deviation values, and each deviation value may be acquired according to the vector difference between one first overlay precision and one corresponding second overlay precision.

For example, each vector arrow 115, which represents a deviation value, may be acquired according to the vector deviation between one vector arrow 113 and its corresponding vector arrow 114.

The vector direction and vector magnitude indicated by the vector arrow 115 may be the deviation direction and deviation magnitude between one vector arrow 113 and its corresponding vector arrow 114. Therefore, whether the pattern of the front layer 100 is deformed, and the deformation degree and manner can be determined according to the vector arrow 115.

It should be noted that FIGS. 8-10 may only exemplarily illustrate a portion of the vector arrows 113, the vector arrows 114, and the vector arrows 115.

Correspondingly, the embodiments of the present disclosure also provide a method for compensating an overlay deviation by using the above-mentioned method for detecting the overlay precision, which may be described in conjunction with the drawings hereinafter.

Figure 11:
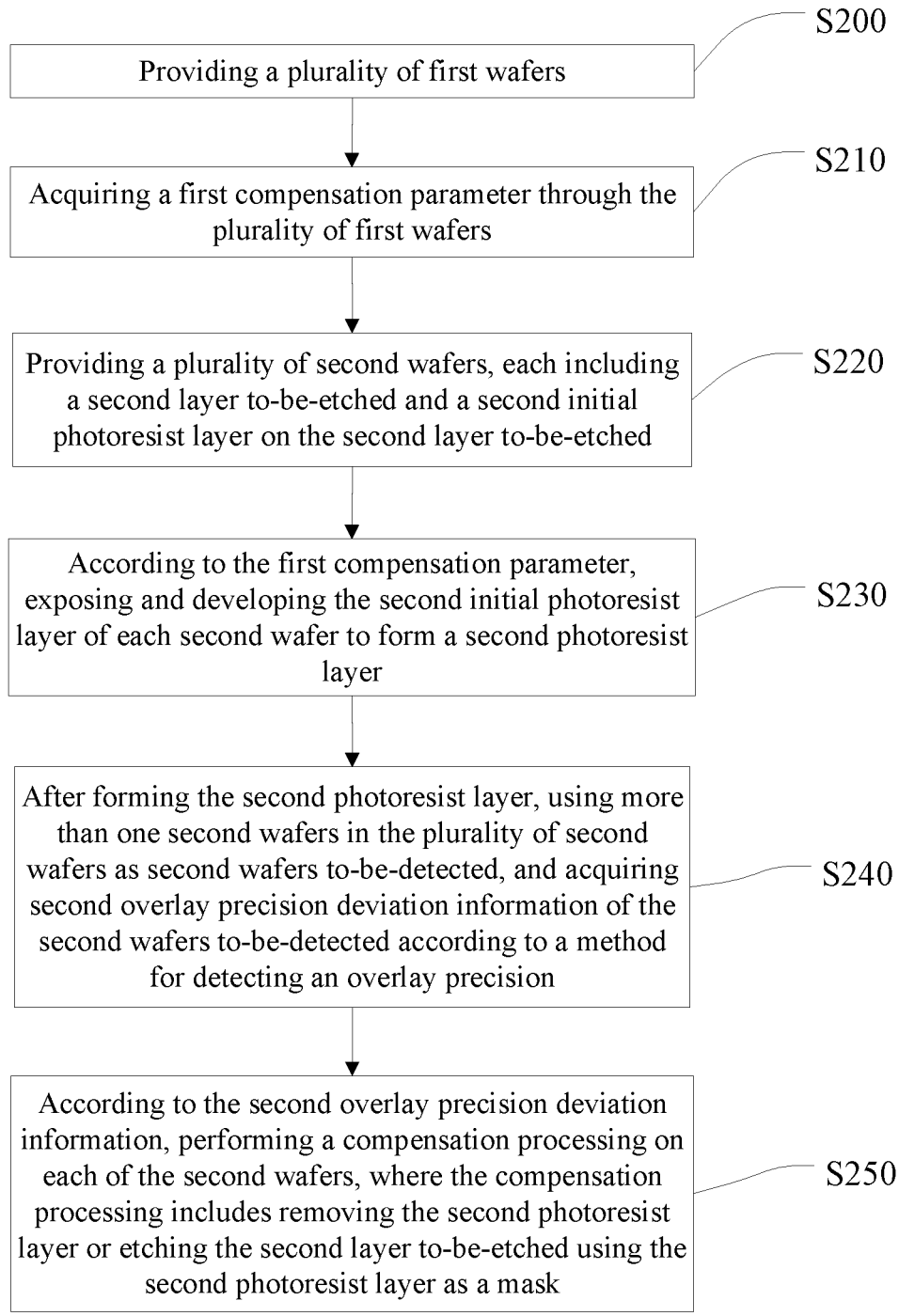
FIG. 11 illustrates a flowchart of an exemplary method for compensating an overlay deviation according to various disclosed embodiments of the present disclosure.

FIG. 11 illustrates a flowchart of an exemplary method for compensating an overlay deviation according to various disclosed embodiments of the present disclosure.

Referring to FIG. 11, the method for compensating the overlay deviation may include:

S200, providing a plurality of first wafers;

S210, acquiring a first compensation parameter through the plurality of first wafers;

S220, providing a plurality of second wafers, where each second wafer may include a second layer to-be-etched and a second initial photoresist layer on the surface of the second layer to-be-etched.

S230, exposing and developing the second initial photoresist layer of each second wafer according to the first compensation parameter to form a second photoresist layer;

S240, after forming the second photoresist layer, using more than one second wafers in the plurality of second wafers as second wafers to-be-detected, and acquiring the second overlay precision deviation information of the second wafers to-be-detected according to the method for detecting the overlay precision; and S250, performing a compensation processing on each of the second wafers according to the second overlay precision deviation information, where the compensation processing may include removing the second photoresist layer or etching the second layer to-be-etched using the second photoresist layer as a mask.

FIGS. 12-31 illustrate structural schematics corresponding to certain stages of an exemplary method for compensating an overlay deviation according to various disclosed embodiments of the present disclosure.

Figure 12:
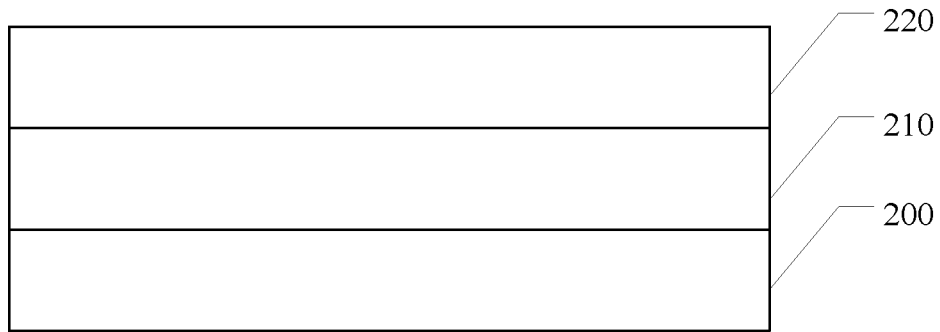
FIGS. 12-31 illustrate structural schematics corresponding to certain stages of an exemplary method for compensating an overlay deviation according to various disclosed embodiments of the present disclosure.
Figure 13:
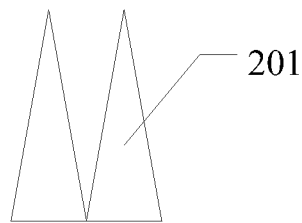

Referring to FIGS. 12-13, FIG. 12 illustrates a cross-sectional structural schematic of the first wafer; and FIG. 13 illustrates a cross-sectional structural schematic of a first front layer mark pattern in FIG. 12, where the plurality of first wafers may be provided.

The first wafer may include a plurality of exposure fields (not labeled).

In one embodiment, each of the first wafers may include a first front layer 200, a first layer to-be-etched 210 on the first front layer 200, and a first initial photoresist layer 220 on the surface of the first layer to-be-etched 210.

In one embodiment, the first front layer 200 may include a plurality of first front layer mark patterns 201.

It should be noted that FIG. 13 may only exemplarily illustrates one first front layer mark pattern 201 in the plurality of first front layer mark patterns 201.

On the one hand, the first front layer mark patterns 201 may be used as the alignment mark for aligning the first photoresist layer and the third photoresist layer with the first front layer 200 when the first photoresist layer and the third photoresist layer are formed subsequently, such that the formed patterns of the first photoresist layer and the third photoresist layer may be aligned with the pattern of the first front layer 200. On the other hand, after forming the first photoresist layer and the third photoresist layer, the first front layer mark patterns 201 may be used to subsequently detect the overlay precision of the first photoresist layer relative to the first front layer 200 and the overlay precision of the third photoresist layer relative to the first front layer 200.

In one embodiment, more than one first wafers in the plurality of first wafers may be used as first wafers to-be-detected subsequently. Before acquiring the first compensation parameter, the first initial photoresist layer 220 of the first wafer to-be-detected may be exposed and developed to form the first photoresist layer, which may refer to FIGS. 14-17 for details.

Figure 14:
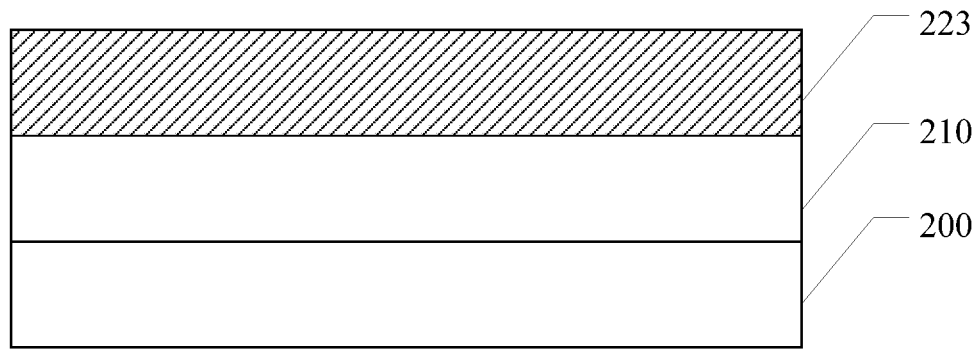

Referring to FIG. 14, FIG. 14 illustrates a cross-sectional structural schematic of a third wafer to-be-detected. More than one first wafers in the plurality of first wafers may be used as third wafers to-be-detected. The first initial photoresist layer 220 of the third wafer to-be-detected may be exposed and developed to form the third photoresist layer 223.

Figure 15:
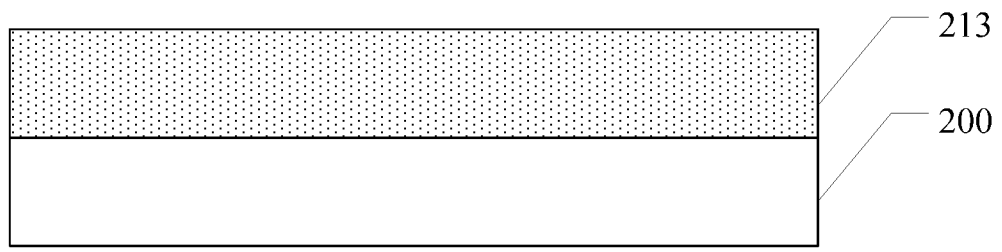
Figure 16:
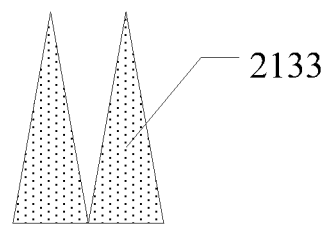

Referring to FIGS. 15-16, FIG. 16 illustrates a cross-sectional structural schematic of the third mark pattern in FIG. 15. The first layer to-be-etched 210 of the third wafer to-be-detected may be etched using the third photoresist layer 223 as a mask to form a third etched layer 213. The measurement of the scanning electron microscope may be used to acquire fourth overlay precision information of the third etched layer 213 of the third wafer to-be-detected.

In one embodiment, the third etched layer 213 may include a plurality of third mark patterns 2133.

It should be noted that FIG. 16 only exemplarily illustrates one third mark pattern 2133 in the plurality of third mark patterns 2133.

The third mark pattern 2133 may be used to detect the fourth overlay precision information.

In one embodiment, the fourth overlay precision information may include a plurality of fourth overlay precisions (or precision values), and each of the fourth overlay precision may be acquired according to one of the third mark patterns 2133.

The first wafer may have a plurality of exposure fields, such that the third wafer to-be-detected may have a plurality of exposure fields.

For example, acquiring each of the fourth overlay precisions according to one of the third mark patterns 2133 may refer to detecting the overlay precision of the third mark pattern 2133 in each exposure field of the third wafer to-be-detected by using the scanning electron microscope measurement, that is, along the direction parallel to the surface of the third etched layer 213, detecting the deviation direction and deviation magnitude of the third mark pattern 2133 relative to its corresponding first front layer mark pattern 201.

Figure 17:
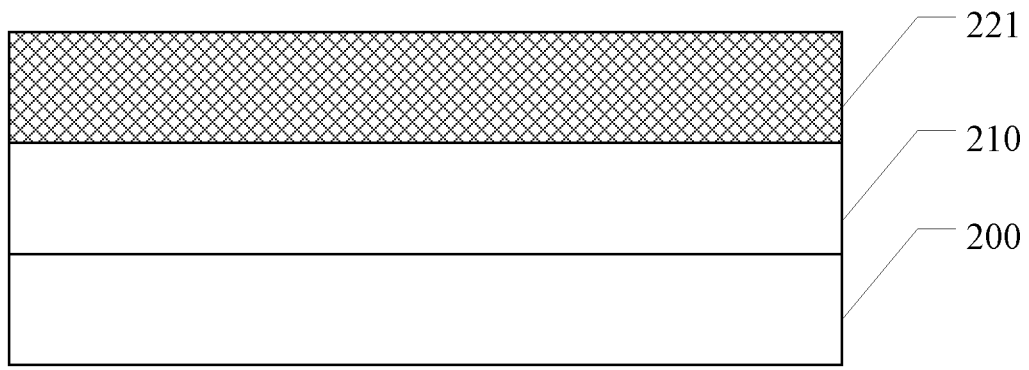
Figure 18:
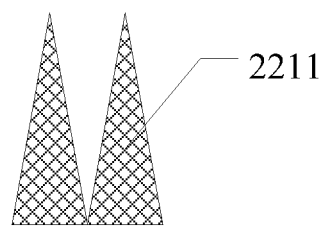

Referring to FIGS. 17-18, FIG. 18 illustrates a cross-sectional structural schematic of the first mark pattern in FIG. 17. More than one first wafers in the plurality of first wafers may be used as first wafers to-be-detected. The first initial photoresist layer 220 of the first wafer to-be-detected may be exposed and developed to form the first photoresist layer 221 according to the fourth overlay precision information.

For example, exposing and developing the first initial photoresist layer 220 of the first wafer to-be-detected according to the fourth overlay precision information may refer to adjusting the process of exposing and developing the first initial photoresist layer 220 of the first wafer to-be-detected by using the plurality of fourth overlay precisions as the compensation parameter.

The overlay precision information obtained by the measurement of the scanning electron microscope may be more accurate. In one embodiment, the fourth overlay precision information may be obtained by the measurement of the scanning electron microscope, such that the fourth overlay precision information may be more accurate. Therefore, after the process of exposing and developing the first initial photoresist layer 220 of the first wafer to-be-detected is adjusted according to the fourth overlay precision information, the overlay precision of the first photoresist layer 221 formed may be relatively high. In such way, on the one hand, the overlay precision of the first wafer to-be-detected may be improved; and on the other hand, it may reduce the quantity of discarded first wafers to-be-detected formed with low pattern precision after subsequently etching the first layer to-be-etched 210 of the first wafer to-be-detected using the first photoresist layer 221 as a mask, thereby improving the semiconductor structure performance and saving the process cost.

In one embodiment, the first photoresist layer 221 may include a plurality of first mark patterns 2211.

The first mark patterns 2133 may be used to subsequently detect the first overlay precision information of the first wafer to-be-detected and the second overlay precision information of the first wafer to-be-detected.

It should be noted that the mask layouts used to form the first photoresist layer 221 and the third photoresist layer 223 are same, such that each of the first mark pattern 2211 may correspond to one of the third mark patterns 2133.

Figure 19:
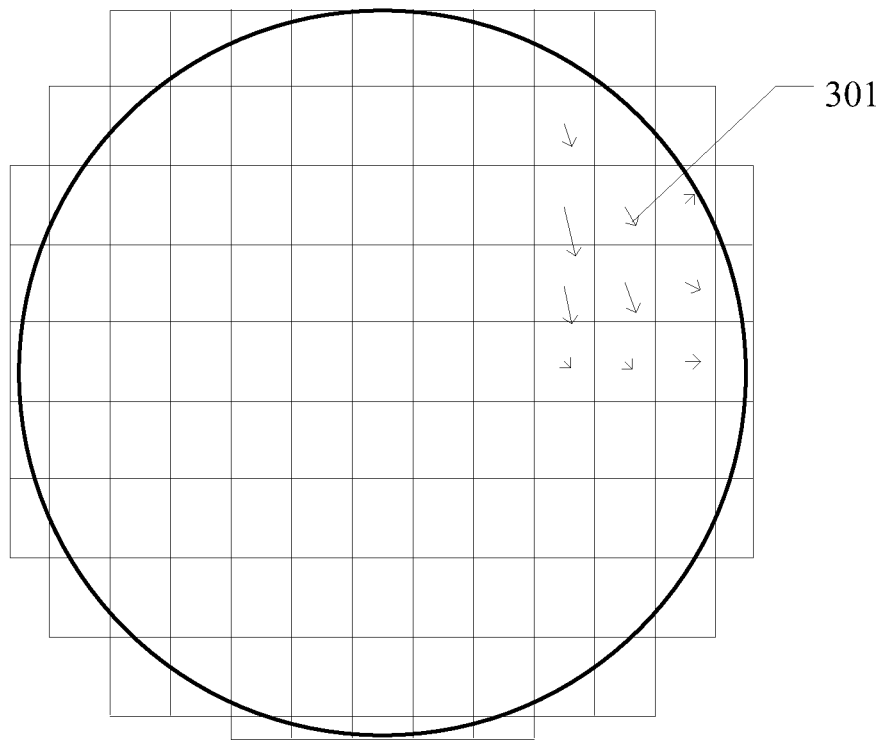

Referring to FIG. 19, FIG. 19 illustrates a schematic of the first overlay precision information of the first wafer to-be-detected. After the first photoresist 221 is formed, the first overlay precision information of the first wafer to-be-detected may be acquired according to the method for detecting the overlay precision.

For example, acquiring the first overlay precision information of the first wafer to-be-detected according to the method for detecting the overlay precision may refer to that, using the optical overlay precision measurement, the first detection may be performed on the first wafer to-be-detected to acquire the first overlay precision information of the first photoresist layer 221.

The optical overlay precision measurement may include the overlay precision measurement based on the imaging and image recognition or the overlay precision measurement based on diffraction.

In one embodiment, the optical overlay precision measurement may be the overlay precision measurement based on the imaging and image recognition.

The first overlay precision information of the first wafer to-be-detected may include a plurality of first overlay precisions of the first wafers to-be-detected. The first overlay precision of each first wafer to-be-detected may be acquired according to one first mark pattern 2211.

The first wafer may have a plurality of exposure fields, such that the first wafer to-be-detected may have a plurality of exposure fields.

Each exposure field of the first wafer to-be-detected may include more than one of the first mark patterns 2211 and more than one of first front layer mark patterns 201. Along the direction perpendicular to the surface of the first photoresist layer 221, each of the first mark patterns 2211 and one of the first front layer mark patterns 201 may correspond to each other.

For example, acquiring the first overlay precision of each first wafer to-be-detected according to one of the first mark patterns 2211 may refer to detecting the first overlay precision of the first mark pattern 2211 in each exposure field when performing the first detection on the first wafer to-be-detected. The first overlay precisions of the first mark patterns 2211 may refer to, along the direction parallel to the surface of the first photoresist layer 221, the acquired deviation directions and deviation magnitudes of the first mark patterns 2211 relative to the corresponding first front layer mark patterns 201 in the first detection, that is, the vector directions and vector magnitudes indicated by the plurality of vector arrows 301.

Figure 20:
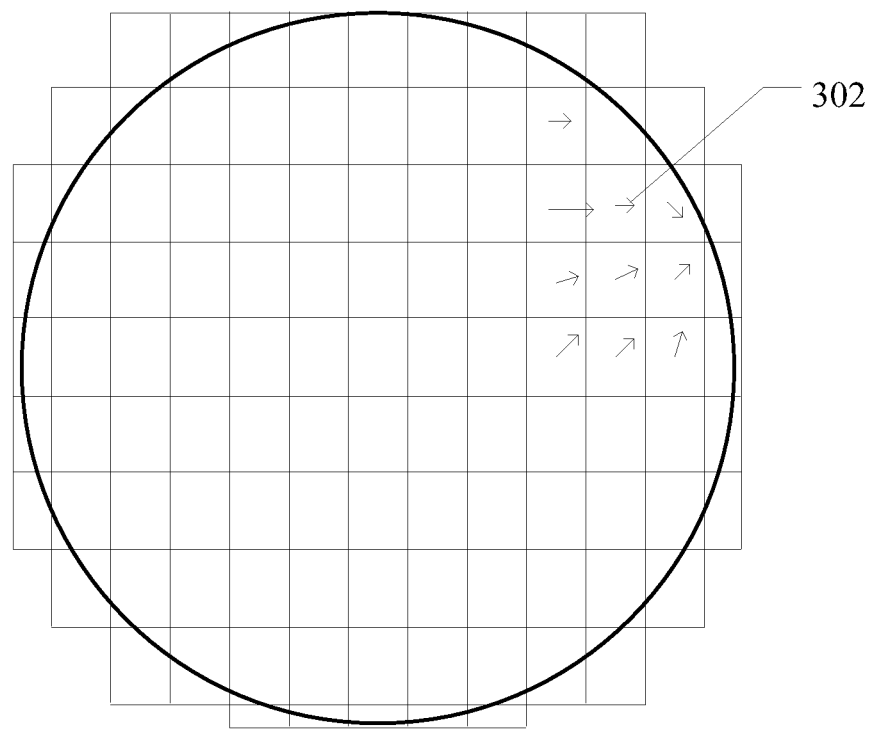

Referring to FIG. 20, FIG. 20 illustrates a schematic of the second overlay precision information of the first wafer to-be-detected. After the first photoresist 221 is formed, the second overlay precision information of the first wafer to-be-detected may be acquired according to the method for detecting the overlay precision.

For example, acquiring the second overlay precision information of the first wafer to-be-detected according to the method for detecting the overlay precision may refer to that, using the optical overlay precision measurement, the second detection may be performed on the first wafer to-be-detected to acquire the second overlay precision information of the first photoresist 221. The wavelength or polarization direction of the light source of the second detection may be different from the wavelength or polarization direction of the light source of the first detection.

The optical overlay precision measurement may include the overlay precision measurement based on the imaging and image recognition or the overlay precision measurement based on diffraction.

In one embodiment, the optical overlay precision measurement may be the overlay precision measurement based on the imaging and image recognition.

The second overlay precision information of the first wafer to-be-detected may include a plurality of second overlay precisions of the first wafers to-be-detected. The second overlay precision of each first wafer to-be-detected may be acquired according to one first mark pattern 2211.

For example, acquiring the second overlay precision of each first wafer to-be-detected according to one of the first mark patterns 2211 may refer to detecting the second overlay precision of the first mark pattern 2211 in each exposure field when performing the second detection on the first wafer to-be-detected. The second overlay precisions of the first mark patterns 2211 may refer to, along the direction parallel to the surface of the first photoresist layer 221, the acquired deviation directions and deviation magnitudes of the first mark patterns 2211 relative to the corresponding first front layer mark patterns 201 in the second detection, that is, the vector directions and vector magnitudes indicated by the plurality of vector arrows 302.

Figure 21:
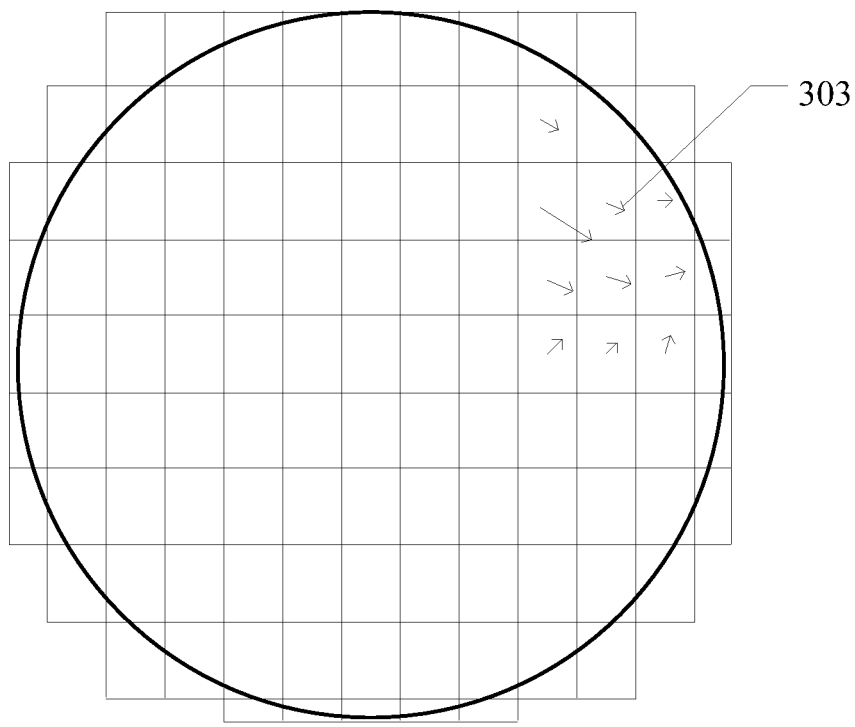

Referring FIG. 21, FIG. 21 illustrates a schematic of the first overlay precision deviation information. After the first photoresist layer 221 is formed, the first overlay precision deviation information of the first wafer to-be-detected may be acquired according to the method for detecting the overlay precision.

In one embodiment, the first overlay precision deviation information of the first wafer to-be-detected may include a plurality of first deviation values, and each first deviation value may be acquired according to the vector difference between the first overlay precision of one first wafer to-be-detected and the second overlay precision of one corresponding first wafer to-be-detected.

For example, each vector arrow 303, which represents a first deviation value, may be acquired according to the vector deviation between one vector arrow 301 and its corresponding vector arrow 302.

The vector direction and vector magnitude indicated by the vector arrow 303 may be the deviation direction and deviation magnitude between one vector arrow 301 and its corresponding vector arrow 302. Therefore, whether the pattern of the first front layer 200 is deformed, and the deformation degree and manner can be determined according to the vector arrow 303.

It should be noted that FIGS. 19-21 may only exemplarily illustrate a portion of the vector arrows 301, the vector arrows 302 and the vector arrows 303.

After the first photoresist layer 221 is formed, the first compensation parameter may be acquired through the plurality of first wafers.

In one embodiment, acquiring the first compensation parameter through the plurality of first wafers may refer to acquiring the first compensation parameter through the fourth overlay precision information and the first overlay precision information of the first wafers to-be-detected, or acquiring the first compensation parameter through the fourth overlay precision information and the second overlay precision information of the first wafers to-be-detected.

The first compensation parameter may be acquired according to the fourth overlay precision information and the first overlay precision information or the second overlay precision information of the first wafers to-be-detected. On the one hand, the first overlay precision information is acquired by detecting the first photoresist layer 221 formed by the calibrated exposure and development step, such that the first compensation parameter may be more accurate; on the other hand, the measurement precision based on the scanning electron microscopy is more accurate, but the measurement time may be longer. The information acquired by the measurement based on the scanning electron microscope may not only be applied to the process of the first photoresist layer 221, but also be applied to the second photoresist formed subsequently through the first compensation parameter. Therefore, while improving the overlay precision of the second photoresist layer, it may reduce the time used for performing the measurement overlay deviation of the second photoresist based on the scanning electron microscopy measurement to form the new second photoresist with high overlay precision, thereby reducing the time for forming the second wafer subsequently.

It should be noted that, since each of the first mark patterns 2211 corresponds to one of the third mark patterns 2133, each fourth overlay precision may correspond to the first overlay precision of one first wafer to-be-detected and the second overlay precision of one first wafer to-be-detected.

In one embodiment, the first compensation parameter may include a plurality of first compensation values; and each of the first compensation values may be the sum of one fourth overlay precision and the first overlay precision or the second overlay precision of the corresponding first wafer to-be-detected.

In another embodiment, the third wafer to-be-detected may not be disposed. After more than one first wafers in the plurality of first wafers are used as the first wafers to-be-detected, the fourth overlay precision information may not be used to adjust the process of exposing and developing the first initial photoresist layer of the first wafer to-be-detected; instead, the first initial photoresist layer of the first wafer to-be-detected may be directly exposed and developed to form the first photoresist layer.

After the first photoresist layer is formed, the first overlay precision deviation information, the first overlay precision information, and the second overlay precision information of the first wafer to-be-detected may be acquired according to the above-mentioned method for detecting the overlay precision.

After the first photoresist layer is formed, using the first photoresist layer as a mask, the first layer to-be-etched of the first wafer to-be-detected may be etched to form the first etched layer. The measurement of the scanning electron microscope may be used to acquire the third overlay precision information of the first etched layer of the first wafer to-be-detected, and the third overlay precision information may be used as the first compensation parameter.

The third overlay precision information is acquired using the measurement of the scanning electron microscope, such that the overlay precision acquired by the measurement is relatively high. Therefore, the third overlay precision information used as the first compensation parameter may improve the pattern overlay precision of the second photoresist subsequently formed; meanwhile, the fourth overlay precision information may not be used to adjust the process of exposing and developing the first initial photoresist layer of the first wafer to-be-detected; instead, the first initial photoresist layer of the first wafer to-be-detected may be directly exposed and developed to form the first photoresist layer, which may save the process time of the semiconductor structure.

Figure 22:
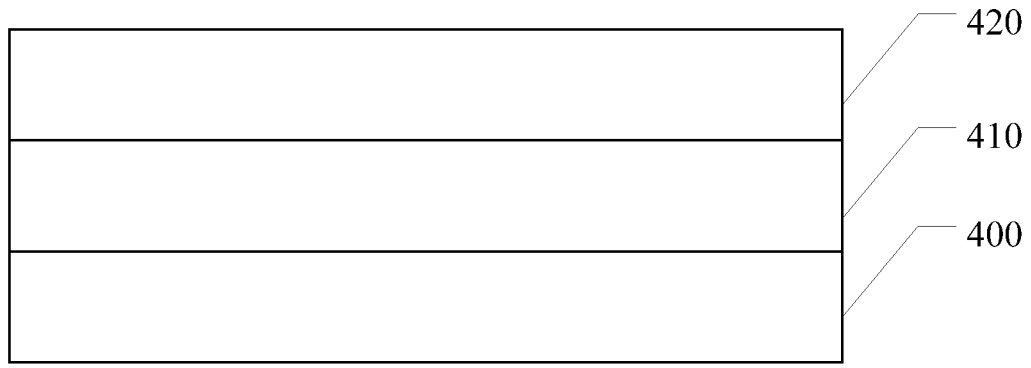
Figure 23:
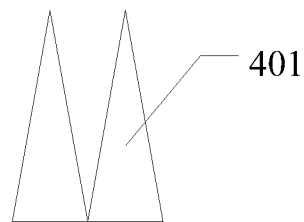

Referring to FIGS. 22-23, FIG. 22 illustrates a cross-sectional structural schematic of the second wafer, and FIG. 23 illustrates a cross-sectional structural schematic of a second front layer mark pattern in FIG. 22, where the plurality of second wafers may be provided.

It should be noted that the second wafers and the first wafers may be wafers with a same design. The first wafers may refer to the first batch of wafers, and the second wafers may refer to the second batch of wafers.

The second wafer may include a plurality of exposure fields (not labeled).

In one embodiment, each of the second wafers may include a second front layer 400, a second layer to-be-etched 410 on the second front layer 400, and a second initial photoresist layer 420 on the surface of the second layer to-be-etched 410.

In one embodiment, the second front layer 400 may include a plurality of second front layer mark patterns 401.

It should be noted that FIG. 23 may only exemplarily illustrates one second front layer mark pattern 401 in the plurality of second front layer mark patterns 401.

On the one hand, the second front layer mark patterns 401 may be used as the alignment mark of the second photoresist layer and the second front layer 400 when the second photoresist layer is formed subsequently, such that the formed pattern of the second photoresist layer may be aligned with the pattern of the second front layer 400. On the other hand, after forming the second photoresist layer, the second front layer mark patterns 401 may be used to subsequently detect the overlay precision of the second photoresist layer relative to the second front layer 400.

Figure 24:
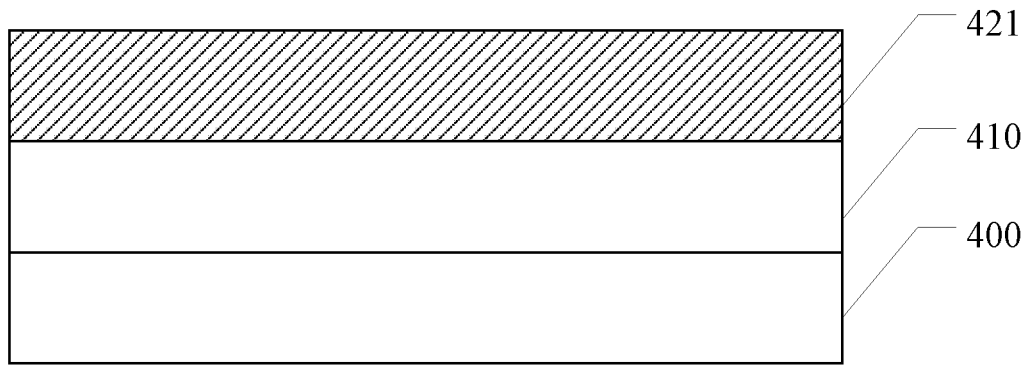
Figure 25:
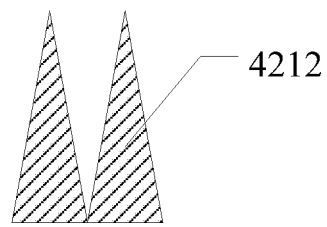

Referring to FIGS. 24-25, FIG. 25 illustrates a cross-sectional structural schematic of the second mark pattern in FIG. 24. According to the first compensation parameter, the second initial photoresist layer 420 of each second wafer may be exposed and developed to form the second photoresist layer 421.

Since the first compensation parameter is used in the exposure and development step when the second photoresist layer 421 is formed, the exposure and development step may be calibrated based on the process deviation of the first wafer. Therefore, it may not only improve the overlay precision of the second photoresist layer 421, but also reduce the time and cost for acquiring the compensation parameter by detecting one portion of the second wafers in the plurality of second wafers and forming the photoresist layers of the other portion of the second wafers in the plurality of second wafers using the compensation parameter.

In one embodiment, the second photoresist layer 421 may include a plurality of second mark patterns 4212.

It should be noted that FIG. 25 may only exemplarily illustrates one second mark pattern 4212 in the plurality of second mark patterns 4212.

On the one hand, the second mark patterns 4212 may be used as the alignment mark for aligning the formed second photoresist layer 421 with the second front layer 400 in the exposure and development step when the second initial photoresist layer 420 is exposed and developed to form the second photoresist layer, such that the formed pattern of the second photoresist layer 421 may be aligned with the pattern of the second front layer 400. On the other hand, after forming the second photoresist layer 421, the second mark patterns 4212 may be used to subsequently detect the overlay precision of the second photoresist layer relative to the second front layer 400.

Figure 26:
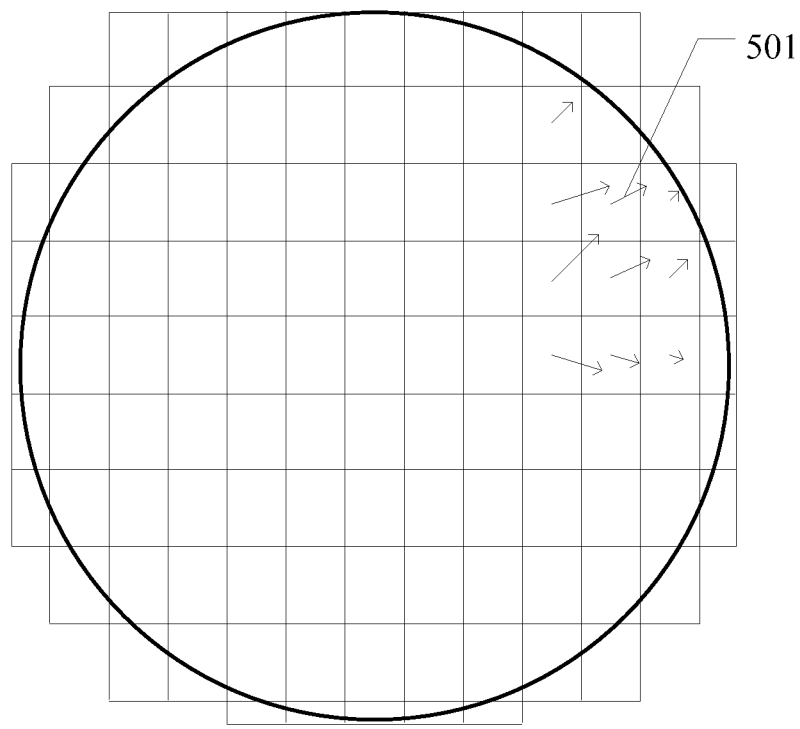
Figure 27:
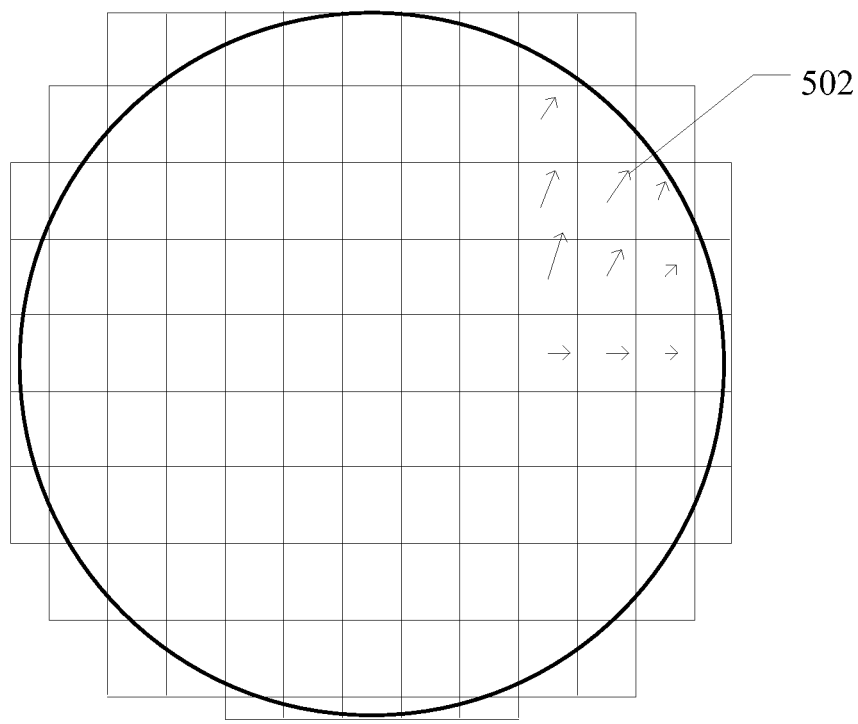
Figure 28:
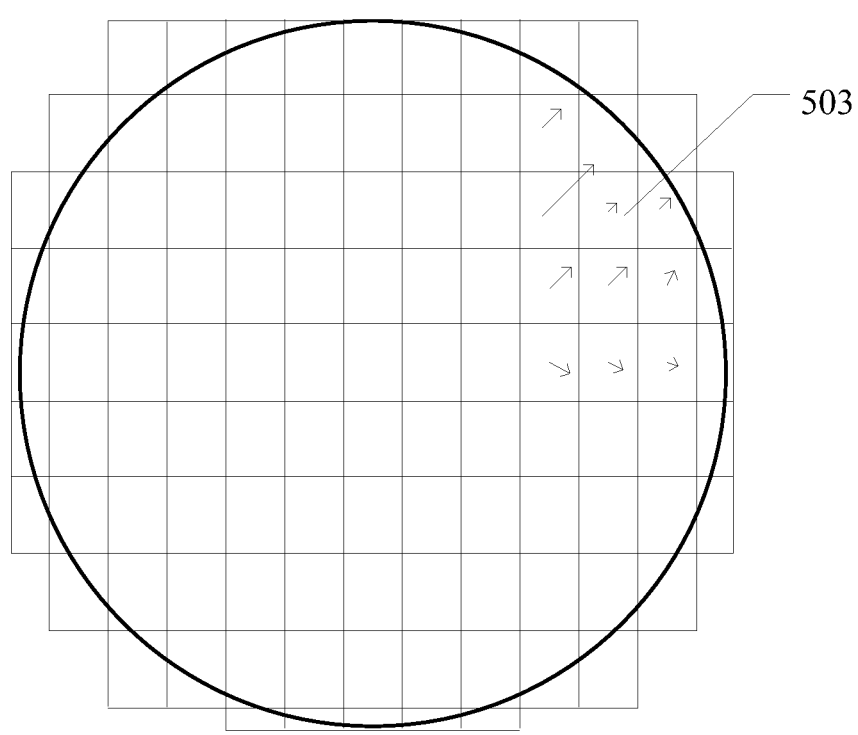

After forming the second photoresist layer 421, more than one second wafers in the plurality of second wafers may be used as the second wafers to-be-detected, and the second overlay precision deviation information of the second wafers to-be-detected may be acquired according to the method for detecting the overlay precision, which may refer to FIGS. 26-28.

Referring to FIG. 26, FIG. 26 illustrates a schematic of the first overlay precision information of the second wafer to-be-detected. After the second photoresist 421 is formed, the first overlay precision information of the second wafer to-be-detected may be acquired according to the method for detecting the overlay precision.

For example, acquiring the first overlay precision information of the second wafer to-be-detected according to the method for detecting the overlay precision may refer to that, using the optical overlay precision measurement, the first detection may be performed on the second wafer to-be-detected to acquire the first overlay precision information of the second photoresist layer 421.

The optical overlay precision measurement may include the overlay precision measurement based on the imaging and image recognition or the overlay precision measurement based on diffraction.

In one embodiment, the optical overlay precision measurement may be the overlay precision measurement based on the imaging and image recognition.

In one embodiment, the light source for the first detection of the second wafer to-be-detected may be same as the light source for the first detection of the first wafer to-be-detected.

The first overlay precision information of the second wafer to-be-detected may include a plurality of first overlay precisions of the second wafers to-be-detected. The first overlay precision of each second wafer to-be-detected may be acquired according to one second mark pattern 4212.

The second wafer may have a plurality of exposure fields, such that the second wafer to-be-detected may have a plurality of exposure fields.

Each exposure field of the second wafer to-be-detected may include more than one of the second mark patterns 4212 and more than one of second front layer mark patterns 401. Along the direction perpendicular to the surface of the second photoresist layer 421, each of the second mark patterns 4212 and one of the second front layer mark patterns 401 may correspond to each other.

For example, acquiring the first overlay precision of each second wafer to-be-detected according to one of the second mark patterns 4212 may refer to detecting the first overlay precision of the second mark pattern 4212 in each exposure field when the first detection is performed on the second wafer to-be-detected.

The first overlay precisions of the second mark patterns 4212 may refer to, along the direction parallel to the surface of the second photoresist layer 421, the acquired deviation directions and deviation magnitudes of the second mark patterns 4212 relative to the corresponding second front layer mark patterns 401 in the first detection, that is, the vector directions and vector magnitudes indicated by the plurality of vector arrows 501.

Referring to FIG. 27, FIG. 27 illustrates a schematic of the second overlay precision information of the second wafer to-be-detected. After the second photoresist 421 is formed, the second overlay precision information of the second wafer to-be-detected may be acquired according to the method for detecting the overlay precision.

For example, acquiring the second overlay precision information of the second wafer to-be-detected according to the method for detecting the overlay precision may refer to that, using the optical overlay precision measurement, the second detection may be performed on the second wafer to-be-detected to acquire the second overlay precision information of the second photoresist 421. The wavelength or polarization direction of the light source of the second detection may be different from the wavelength or polarization direction of the light source of the first detection.

The optical overlay precision measurement may include the overlay precision measurement based on the imaging and image recognition or the overlay precision measurement based on diffraction.

In one embodiment, the optical overlay precision measurement may be the overlay precision measurement based on the imaging and image recognition.

In one embodiment, the light source for the second detection of the second wafer to-be-detected may be same as the light source for the second detection of the first wafer to-be-detected.

The second overlay precision information of the second wafer to-be-detected may include a plurality of second overlay precisions of the second wafers to-be-detected. The second overlay precision of each second wafer to-be-detected may be acquired according to one second mark pattern 4212.

For example, acquiring the second overlay precision of each second wafer to-be-detected according to one of the second mark patterns 4212 may refer to detecting the second overlay precision of the second mark pattern 4212 in each exposure field when performing the second detection on the second wafer to-be-detected. The second overlay precisions of the second mark patterns 4212 may refer to, along the direction parallel to the surface of the second photoresist layer 421, the acquired deviation directions and deviation magnitudes of the second mark patterns 4212 relative to the corresponding second front layer mark patterns 401 in the second detection, that is, the vector directions and vector magnitudes indicated by the plurality of vector arrows 502.

Referring FIG. 28, FIG. 28 illustrates a schematic of the second overlay precision deviation information. After the second photoresist layer 421 is formed, the second overlay precision deviation information of the second wafer to-be-detected may be acquired according to the method for detecting the overlay precision.

In one embodiment, the second overlay precision deviation information of the second wafer to-be-detected may include a plurality of second deviation values, and each second deviation value may be acquired according to the vector difference between the first overlay precision of one second wafer to-be-detected and the second overlay precision of one corresponding second wafer to-be-detected.

For example, each vector arrow 503, which represents a second deviation value, may be acquired according to the vector deviation between one vector arrow 501 and its corresponding vector arrow 502.

The vector direction and vector magnitude indicated by the vector arrow 503 may be the deviation direction and deviation magnitude between one vector arrow 501 and its corresponding vector arrow 502. Therefore, whether the pattern of the second front layer 400 is deformed, and the deformation degree and manner can be determined according to the vector arrow 503.

It should be noted that FIGS. 26-28 may only exemplarily illustrate a portion of the vector arrows 501, the vector arrows 502 and the vector arrows 503.

Figure 29:
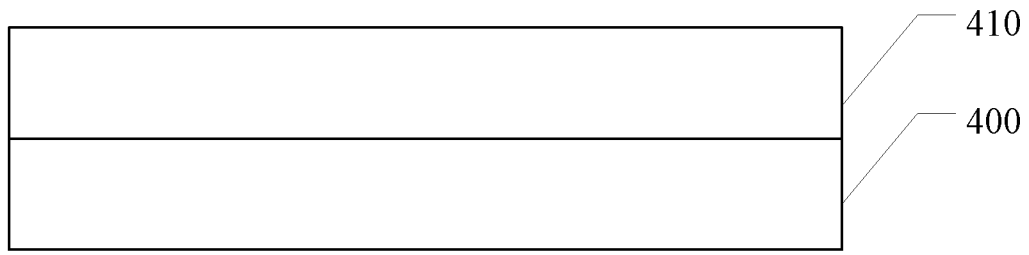
Figure 30:
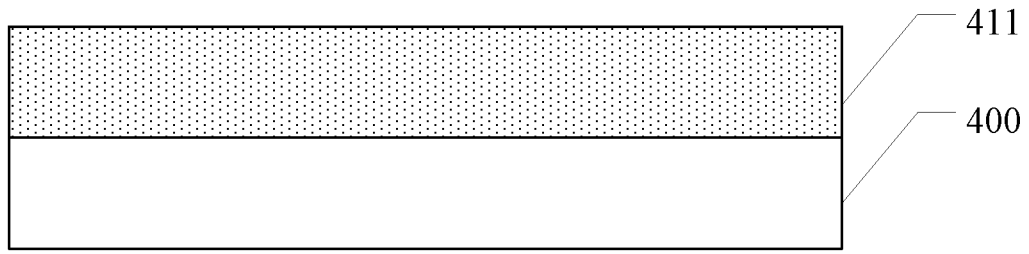

Referring to FIGS. 29-30, after the second overlay precision deviation information is acquired, the compensation processing may be performed on each second wafer according to the second overlay precision deviation information. The compensation processing may include removing the second photoresist layer 421 or etching the second layer to-be-etched 410 to form a second etched layer 411 by using the second photoresist layer 421 as a mask.

It should be noted that FIG. 29 illustrates a cross-sectional structural schematic of the second wafer after the second photoresist layer is removed in the compensation processing; and FIG. 30 illustrates a cross-sectional structural schematic of the second wafer after the second layer to-beetched is etched using the second photoresist layer as a mask in the compensation processing.

The compensation processing is performed according to the second overlay precision deviation information. On the one hand, through the second overlay precision deviation information, the pattern deformation of the second front layer 400 may be obtained before etching the second layer to-be-etched 410 using the second photoresist 421 as a mask. Moreover, according to the pattern deformation of the second front layer 400, it may determine the influence of the pattern deformation of the second front layer 400 on the pattern overlay precision of the second photoresist layer 421. That is, whether the pattern deformation of the second front layer 400 causes excessive reduction of the pattern overlay precision of the second photoresist layer 421, such that the pattern overlay precision of the second photoresist layer 421 formed by the calibrated exposure and development step may still be relatively low. Therefore, the compensation processing may be subsequently performed on the second wafer according to the influence of the pattern deformation of the second front layer 400 on the pattern overlay precision of the second photoresist layer 421, thereby improving the pattern precision of the second wafer.

On the other hand, when it determines that the pattern deformation of the second front layer 400 does not excessively reduce the pattern overlay precision of the second photoresist layer 421, that is, the overlay precision of the second photoresist layer 421 compensated by the first compensation parameter is high, the second photoresist layer 421 may be directly used as a mask to etch the second layer to-be-etched 410, thereby improving the overlay precision of the formed pattern after subsequently etching the layer to-be-etched and the overlay precision of the pattern transferred to the second wafer. When it determines that the pattern deformation of the second front layer 400 does excessively reduce the pattern overlay precision of the second photoresist layer 421, that is, the overlay precision of the second photoresist layer 421 compensated by the first compensation parameter is still relatively low, the second photoresist layer 421 may be removed before etching the second layer to-be-etched 410 using the second photoresist layer 421 as a mask. Therefore, the semiconductor structures with low overlay precision formed by the second photoresist 421 with relatively low overlay precisions may be reduced; meanwhile, the photoresist layer with a relatively high overlay precision may still be reformed on the surface of the second layer to-be-etched 410 after the second photoresist 421 is removed because the second layer to-be-etched 410 is not etched; furthermore, the second etched layer with a high pattern precision may be directly formed by forming the photoresist layer with a high precision. Therefore, the overlay precision of the pattern transferred to the second wafer may be improved with a simple process and a low cost.

In one embodiment, according to the second overlay precision deviation information, performing the compensation processing on each second wafer may include acquiring an error parameter according to the first overlay precision deviation information and the second overlay precision deviation information; when the error parameter is within a preset range, etching the second layer to-be-etched 410 using the second photoresist layer 421 as a mask; and when the error parameter is outside a preset range, removing the second photoresist layer 421.

The error parameter may be acquired according to the first overlay precision deviation information and the second overlay precision deviation information; when the error parameter is within a preset range, the second layer to-be-etched 410 may be etched using the second photoresist layer 421 as a mask; and when the error parameter is outside a preset range, the second photoresist layer 421 may be removed. Therefore, the error parameter may be used to acquire the differences between the deformation magnitude and manner of the pattern of the second front layer 400 and the deformation magnitude and manner of the pattern of the first front layer 200; the difference magnitude may be determined according to the relationship between the error parameter and the preset range; and such that, based on the magnitude difference, that is, whether the error parameter is in the preset range, it may determine that whether the calibration of the first compensation parameter for the exposure and development step of forming the second photoresist layer 421 is accurate, thereby performing the compensation processing according to the determination result. In such way, the following may be implemented: when the calibration is relatively accurate, that is, the error parameter is within the preset range, the second photoresist layer 421 with a relatively high overlay precision may be used as a mask to etch the second layer to-be-etched; and when the calibration is not relatively accurate, that is, the error parameter is outside the preset range, the second photoresist layer 421 may be removed.

In another embodiment, according to the second overlay precision deviation information, performing the compensation processing on each second wafer may include, when the second overlay precision deviation information is within the preset range, etching the second layer to-be-etched using the second photoresist layer as a mask; and when the second overlay precision deviation information is outside the preset range, removing the second photoresist layer.

When the second overlay precision deviation information is within the preset range, the second layer to-be-etched 410 is etched using the second photoresist layer 421 as a mask; and when the second overlay precision deviation information is outside the preset range, the second photoresist layer 421 is removed. Therefore, based on the relationship between the second overlay precision deviation information and the preset range, it may determine whether the pattern deformation of the second front layer 400 is relatively large, and whether the relatively large pattern deformation of the second front layer 400 results in a relatively large reduction of the pattern overlay precision of the second photoresist layer 421 compensated by the first compensation parameter. That is, when the second overlay precision deviation information is within the preset range, the pattern deformation of the second front layer 400 may be relatively small, the influence on the pattern overlay precision of the second photoresist layer 421 may be low, and the pattern overlay precision of the second photoresist layer 421 compensated by the first compensation parameter may be high; and when the second overlay precision deviation information is outside the preset range, the pattern deformation of the second front layer 400 may be relatively large, the influence on the pattern overlay precision of the second photoresist layer 421 may be high, and the pattern overlay precision of the second photoresist layer 421 compensated by the first compensation parameter may still be low. In such way, the compensation processing may be performed subsequently based on the determination to improve the pattern precision of the semiconductor structure.

Figure 31:
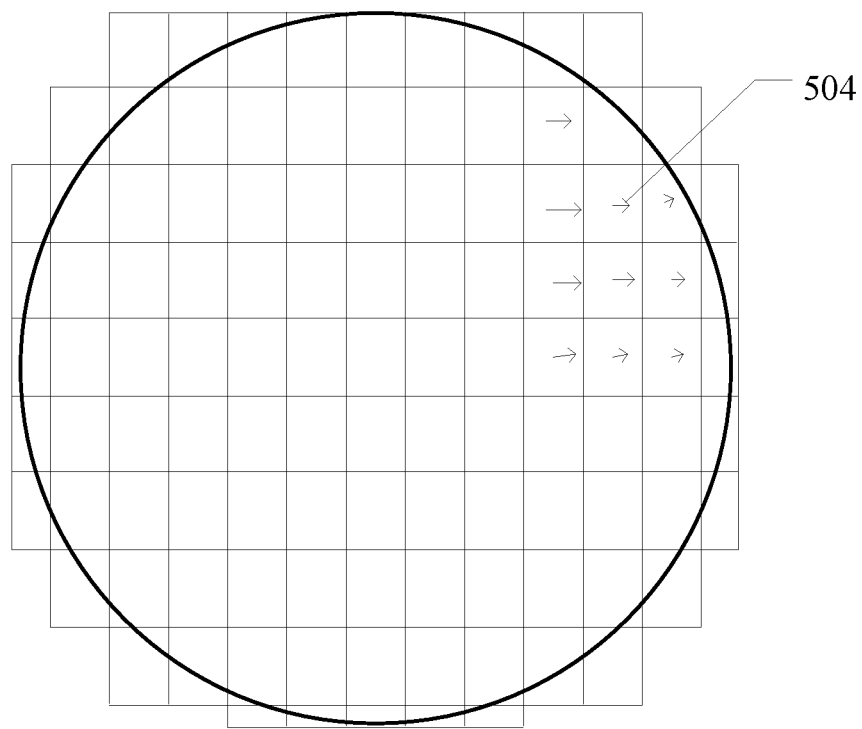

Referring to FIG. 31, FIG. 31 illustrates a schematic of the error parameter which may be acquired according to the first overlay precision deviation information and the second overlay precision deviation information.

In one embodiment, the error parameter may be the deviation between the first overlay precision deviation information and the second overlay precision deviation information.

For example, the error parameter may include a plurality of error deviation values, and each of the error deviation values may be a vector difference between a first deviation value and its corresponding second deviation value. Each vector arrow 504, which represents an error deviation value, may be acquired according to the vector deviation between one vector arrow 303 and its corresponding vector arrow 503.

The vector direction and vector magnitude indicated by the vector arrow 504 may be the deviation direction and deviation magnitude between one vector arrow 503 and its corresponding vector arrow 303. Therefore, through the vector arrow 504, it may determine the difference magnitude between the deformation magnitude and manner of the pattern of the second front layer 400 and the deformation magnitude and manner of the pattern of the first front layer 200.

In one embodiment, the error parameter in the preset range refers to that the plurality of error deviation values may be all less than or equal to the preset value.

In another embodiment, when the error parameter includes the plurality of error deviation values, the error parameter in the preset range refers to that a portion of the plurality of error deviation values may be less than or equal to the preset value. The quantity of the portion of the plurality of error deviation values may be a preset quantity or a preset ratio. For example, if 98% of all error deviation values is less than or equal to the preset value, the error parameter may be within the preset range; or if 98 error deviation values are less than or equal to the preset value, the error parameter may be within the preset range.

In another embodiment, the error parameter may be an average value of the plurality of error deviation values. When the average value is less than or equal to the preset value, the error parameter may be within the preset range.

In another embodiment, the third deviation information may be acquired according to the deviation between the first overlay precision deviation information and the second overlay precision deviation information. The third deviation information may be used as a sample to obtain the deviation normal distribution information, and the error parameter may be obtained according to the deviation normal distribution information.

For example, the third deviation information may include a plurality of third deviation values, and each of the third deviation values may be the vector difference between a first deviation value and its corresponding second deviation value. According to the 2-sigma principle or the 3-sigma principle, the plurality of third deviation values may be used as a sample to compute the normal distribution data of the third deviation information which is the error parameter. When the normal distribution data is less than or equal to the preset value, the error parameter may be within the preset range.

In one embodiment, the compensation processing may further include, after removing the second photoresist layer 421, forming a fourth photoresist layer on the surface of the second layer to-be-etched 410. Therefore, the overlay precision of the pattern transferred to the second wafer may be improved by forming the fourth photoresist layer with high overlay precision.

Although the present disclosure has been disclosed above, the present disclosure is not limited thereto. Any changes and modifications may be made by those skilled in the art without departing from the spirit and scope of the disclosure, and the scope of the disclosure should be determined by the scope defined by the appended claims.

What is claimed is:

1. A method for detecting an overlay precision, comprising:
   providing a wafer to-be-detected, wherein the wafer to-be-detected includes a photoresist layer which has been exposed and developed;
   performing a first detection on the wafer to-be-detected using an optical overlay precision measurement and acquiring first overlay precision information of the photoresist layer, the optical overlay precision measurement including an overlay precision measurement based on imaging and image recognition;
   performing a second detection on the wafer to-be-detected using the optical overlay precision measurement, and acquiring second overlay precision information of the photoresist layer, wherein a wavelength or a polarization direction of a light source of the second detection is different from a wavelength or a polarization direction of a light source of the first detection; and
   acquiring overlay precision deviation information of the wafer to-be-detected according to the first overlay precision information and the second overlay precision information.

2. The method according to claim 1, wherein:
   the photoresist layer includes a plurality of mark patterns;
   the first overlay precision information includes a plurality of first overlay precisions, each being acquired according to one mark pattern; and
   the second overlay precision information includes a plurality of second overlay precisions, each being acquired according to one mark pattern.

3. The method according to claim 2, wherein:
   the overlay precision deviation information of the wafer to-be-detected includes a plurality of deviation values, each being acquired according to a vector difference between one first overlay precision and one second overlay precision.

4. A method for compensating an overlay deviation, comprising:
   providing a plurality of first wafers;
   acquiring a first compensation parameter through the plurality of first wafers;
   providing a plurality of second wafers, each including a second layer to-be-etched and a second initial photoresist layer on the second layer to-be-etched;
   according to the first compensation parameter, exposing and developing the second initial photoresist layer of each second wafer to form a second photoresist layer;
   after forming the second photoresist layer, using more than one second wafers in the plurality of second wafers as second wafers to-be-detected, and acquiring second overlay precision deviation information of the second wafers to-be-detected according to a method for detecting an overlay precision, wherein the method for detecting the overlay precision includes:
      providing a wafer to-be-detected, wherein the wafer to-be-detected includes a photoresist layer which has been exposed and developed;
      performing a first detection on the wafer to-be-detected using an optical overlay precision measurement and acquiring first overlay precision information of the photoresist layer, the optical overlay precision measurement including an overlay precision measurement based on imaging and image recognition;

performing a second detection on the wafer to-be-detected using the optical overlay precision measurement, and acquiring second overlay precision information of the photoresist layer, wherein a wavelength or a polarization direction of a light source of the second detection is different from a wavelength or a polarization direction of a light source of the first detection; and acquiring overlay precision deviation information of the wafer to-be-detected according to the first overlay precision information and the second overlay precision information; and according to the second overlay precision deviation information, performing a compensation processing on each of the second wafers, wherein the compensation processing includes removing the second photoresist layer or etching the second layer to-be-etched using the second photoresist layer as a mask.

5. The method according to claim 4, wherein according to the second overlay precision deviation information, performing the compensation processing on each of the second wafers includes:

when the second overlay precision deviation information is within a preset range, etching the second layer to-be-etched using the second photoresist layer as the mask; and when the second overlay precision deviation information is outside the preset range, removing the second photoresist layer.

6. The method according to claim 4, wherein:
each of the plurality of first wafers includes a first layer to-be-etched and a first initial photoresist layer on the first layer to-be-etched.

7. The method according to claim 6, further including:
using more than one first wafers in the plurality of first wafers as first wafers to-be-detected;

before acquiring the first compensation parameter, exposing and developing the first initial photoresist layer of a first wafer to-be-detected to form a first photoresist layer; and after forming the first photoresist layer, according to the method for detecting the overlay precision, acquiring first overlay precision deviation information, the first overlay precision information and the second overlay precision information of the first wafer to-be-detected.

8. The method according to claim 7, wherein according to the second overlay precision deviation information, performing the compensation processing on each of the second wafers includes:

acquiring an error parameter according to the first overlay precision deviation information and the second overlay precision deviation information;

when the error parameter is within a preset range, etching the second layer to-be-etched using the second photoresist layer as the mask; and when the error parameter is outside the preset range, removing the second photoresist layer.

9. The method according to claim 8, wherein:
the error parameter is acquired according to a deviation between the first overlay precision deviation information and the second overlay precision deviation information.

10. The method according to claim 8, wherein:
third deviation information is acquired according to a deviation between the first overlay precision deviation information and the second overlay precision deviation information;

the third deviation information is used as a sample to obtain deviation normal distribution information; and the error parameter is obtained according to the deviation normal distribution information.

11. The method according to claim 7, wherein forming the first photoresist layer includes:

using more than one first wafers in the plurality of first wafers as third wafers to-be-detected;

exposing and developing a first initial photoresist layer of a third wafer to-be-detected to form a third photoresist layer;

using the third photoresist layer as a mask, etching a first layer to-be-etched of the third wafer to-be-detected to form a third etched layer;

using a measurement of a scanning electron microscope, acquiring fourth overlay precision information of the third etched layer of the third wafer to-be-detected; and according to the fourth overlay precision information, exposing and developing the first initial photoresist layer of the first wafer to-be-detected to form the first photoresist layer.

12. The method according to claim 11, wherein:
the first compensation parameter is acquired according to the fourth overlay precision information and the first overlay precision information of the first wafer to-be-detected; or the first compensation parameter is acquired according to the fourth overlay precision information and the second overlay precision information of the first wafer to-be-detected.

13. The method according to claim 12, wherein:
the third etched layer includes a plurality of third mark patterns; and the fourth overlay precision information includes a plurality of fourth overlay precisions, each being acquired according to one of the plurality of third mark patterns.

14. The method according to claim 13, wherein:
the first photoresist layer includes a plurality of first mark patterns corresponding to the plurality of third mark patterns;

the first overlay precision information of the first wafer to-be-detected includes a plurality of first overlay precisions of the first wafer to-be-detected, each first overlay precision being acquired according to a first mark pattern;

the second overlay precision information of the first wafer to-be-detected includes a plurality of second overlay precisions of the first wafer to-be-detected, each second overlay precision being acquired according to a first mark pattern; and the first compensation parameter includes a plurality of first compensation values, each being a sum of a fourth overlay precision and a first overlay precision or a second overlay precision of a corresponding first wafer to-be-detected.

15. The method according to claim 7, wherein acquiring the first compensation parameter includes:

using the first photoresist layer of the first wafer to-be-detected as a mask, the first layer to-be-etched of the first wafer to-be-detected is etched to form a first etched layer; and using a measurement of a scanning electron microscope, third overlay precision information of the first etched layer of the first wafer to-be-detected is acquired.

16. The method according to claim 4, wherein:
the compensation processing further includes, after removing the second photoresist layer, forming a fourth photoresist layer on the second layer to-be-etched.

17. The method according to claim 4, wherein:
the photoresist layer includes a plurality of mark patterns;
the first overlay precision information includes a plurality of first overlay precisions, each being acquired according to one mark pattern; and
the second overlay precision information includes a plurality of second overlay precisions, each being acquired according to one mark pattern.

18. The method according to claim 17, wherein:
the overlay precision deviation information of the wafer to-be-detected includes a plurality of deviation values, each being acquired according to a vector difference between one first overlay precision and one second overlay precision.

* * * * *